(12) United States Patent
O'Connor et al.

(10) Patent No.: US 6,341,009 B1
(45) Date of Patent: *Jan. 22, 2002

(54) LASER DELIVERY SYSTEM AND METHOD FOR PHOTOLITHOGRAPHIC MASK REPAIR

(75) Inventors: John O'Connor, Commack; Qiang Fu, Port Jefferson Station, both of NY (US)

(73) Assignee: Quantronix Corporation, East Setauket, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/512,580

(22) Filed: Feb. 24, 2000

(Under 37 CFR 1.47)

(51) Int. Cl.[7] .................. G03B 27/54; G03B 27/42; G03B 27/32; G01N 21/88
(52) U.S. Cl. .............. 355/67; 355/53; 355/77; 250/559.45
(58) Field of Search .............. 355/53, 30, 67–71, 355/77; 356/394, 398–400, 237; 430/5, 22, 30, 311; 250/559.45, 559.46

(56) References Cited

U.S. PATENT DOCUMENTS

| 4,087,672 A | 5/1978 | Yi |
| 4,114,018 A | 9/1978 | Von Allmen et al. |
| 4,218,142 A | * 8/1980 | Krygere et al. ............. 356/394 |
| 4,316,074 A | 2/1982 | Daly |
| 4,347,001 A | * 8/1982 | Levy et al. ................. 356/398 |
| 4,413,342 A | 11/1983 | Cohen et al. |
| 4,507,787 A | 3/1985 | Daly et al. |
| 4,507,789 A | 3/1985 | Daly et al. |
| 4,509,175 A | 4/1985 | Daly et al. |

(List continued on next page.)

FOREIGN PATENT DOCUMENTS

DE                41 19 024 A1    12/1992

Primary Examiner—David M. Gray
Assistant Examiner—Hung Henry Nguyen
(74) Attorney, Agent, or Firm—Nixon Peabody LLP; Tim L. Brackett, Jr.

(57) ABSTRACT

A system and method for photolithographic mask repair. The system includes a structure for supporting a mask to be operated on, a laser emitting device for effecting mask repair, a light source adjacent the support structure for selected illumination of the mask, a laser processor for effecting sequential angular manipulation of a laser beam projecting from the laser emitting device, a computer device for controlling the sequential angular manipulation so as to capture a generally complete waveform of the beam, and a microscope for multi-aspect viewing of the mask during navigation of the beam about the mask. The computer device, simultaneously with manipulation of the beam, effecting fine motion control of the beam, controlled movement of the motorized aperture for effecting the sequential angular manipulation, controlled support structure movement, and image data processing.

24 Claims, 18 Drawing Sheets

U.S. PATENT DOCUMENTS

| | | |
|---|---|---|
| 4,579,430 A | 4/1986 | Bille |
| 4,617,666 A | 11/1986 | Liu |
| 4,618,957 A | 11/1986 | Liu |
| 4,630,274 A | 12/1986 | Schäfer |
| 4,637,026 A | 1/1987 | Liu |
| 4,665,913 A | 5/1987 | L'Esperance, Jr. |
| 4,675,500 A | 6/1987 | Kunz et al. |
| 4,677,286 A | 6/1987 | Liu |
| 4,727,381 A | 2/1988 | Bille et al. |
| 4,729,372 A | 3/1988 | L'Esperance, Jr. |
| 4,732,473 A | 3/1988 | Bille et al |
| 4,733,660 A | 3/1988 | Itzkan |
| 4,764,930 A | 8/1988 | Bille et al. |
| 4,778,693 A | 10/1988 | Drozdowicz et al. |
| 4,793,694 A | 12/1988 | Liu |
| 4,838,679 A | 6/1989 | Bille |
| 4,839,493 A | 6/1989 | Herziger et al. |
| 4,848,340 A | 7/1989 | Bille et al. |
| 4,881,808 A | 11/1989 | Bille et al. |
| 4,901,718 A | 2/1990 | Bille et al. |
| 4,907,586 A | 3/1990 | Bille et al. |
| 4,925,523 A | 5/1990 | Braren et al. |
| 4,926,489 A * | 5/1990 | Danielson et al. .............. 382/8 |
| 4,930,505 A | 6/1990 | Hatje |
| 4,942,586 A | 7/1990 | Lai |
| 4,988,163 A | 1/1991 | Cohen et al. |
| 4,988,348 A | 1/1991 | Bille |
| 5,042,015 A | 8/1991 | Stringer |
| 5,062,702 A | 11/1991 | Bille |
| 5,093,548 A | 3/1992 | Schmidt-Hebbel |
| 5,098,426 A | 3/1992 | Sklar et al. |
| 5,105,392 A | 4/1992 | Stringer et al. |
| 5,141,506 A | 8/1992 | York |
| 5,148,445 A | 9/1992 | Liu et al. |
| 5,207,668 A | 5/1993 | L'Esperance, Jr. |
| 5,208,437 A | 5/1993 | Miyauchi et al. |
| 5,219,343 A | 6/1993 | L'Esperance, Jr. |
| 5,220,536 A | 6/1993 | Stringer et al. |
| 5,235,606 A | 8/1993 | Mourou et al. |
| 5,246,435 A | 9/1993 | Bille et al. |
| 5,269,778 A | 12/1993 | Rink et al. |
| 5,289,407 A | 2/1994 | Strickler et al. |
| 5,312,396 A | 5/1994 | Feld et al. |
| 5,389,786 A | 2/1995 | Itoh et al. |
| 5,422,861 A | 6/1995 | Stringer et al. |
| 5,454,902 A | 10/1995 | Zinck et al. |
| 5,606,534 A | 2/1997 | Stringer et al. |
| 5,636,028 A | 6/1997 | Stringer et al. |
| 5,656,186 A | 8/1997 | Mourou et al. |
| 5,663,569 A * | 9/1997 | Hayano .................. 250/559.45 |
| 5,720,894 A | 2/1998 | Neev et al. |
| 5,831,737 A | 11/1998 | Stringer et al. |
| 5,943,351 A | 8/1999 | Zhou et al. |
| 6,002,695 A | 12/1999 | Alfrey et al. |
| 6,038,015 A * | 3/2000 | Kawata ........................ 355/67 |

\* cited by examiner

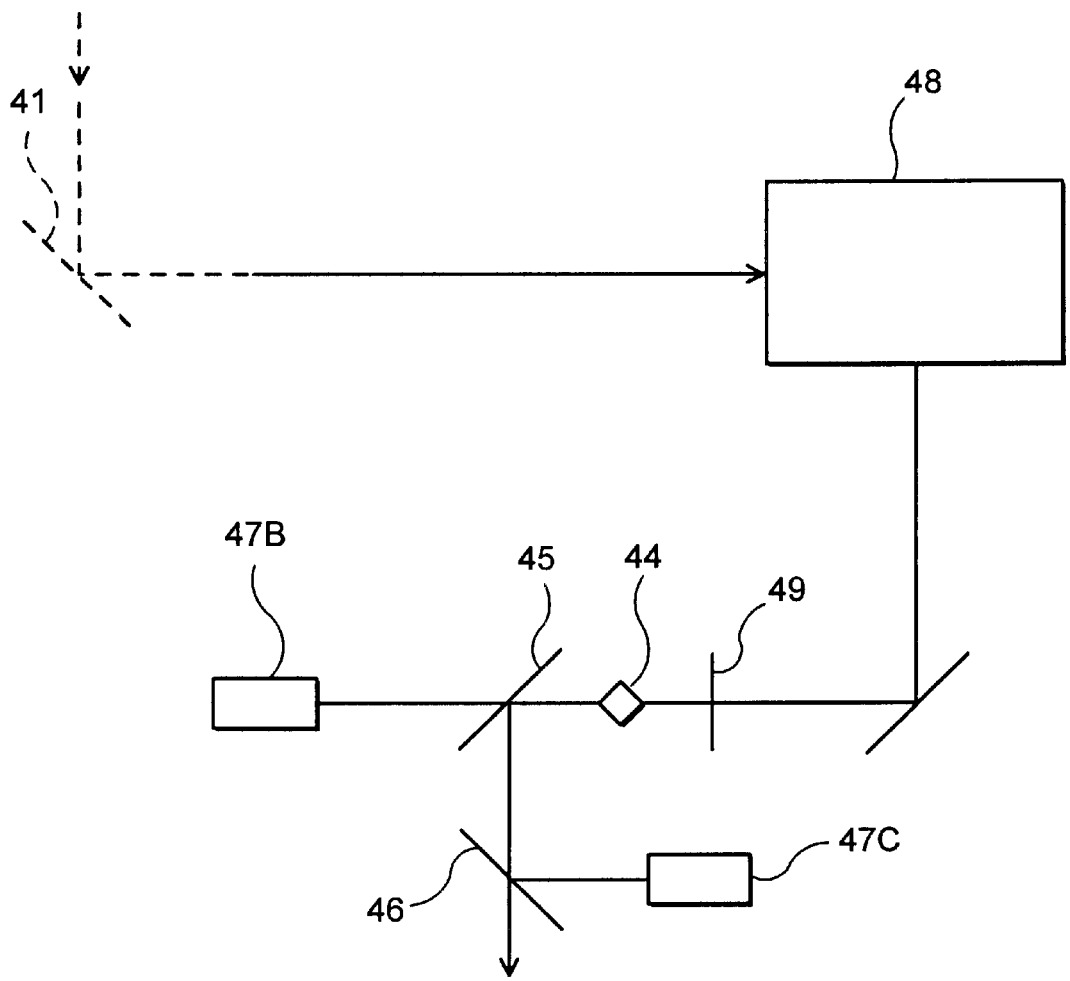
F I G. 6A

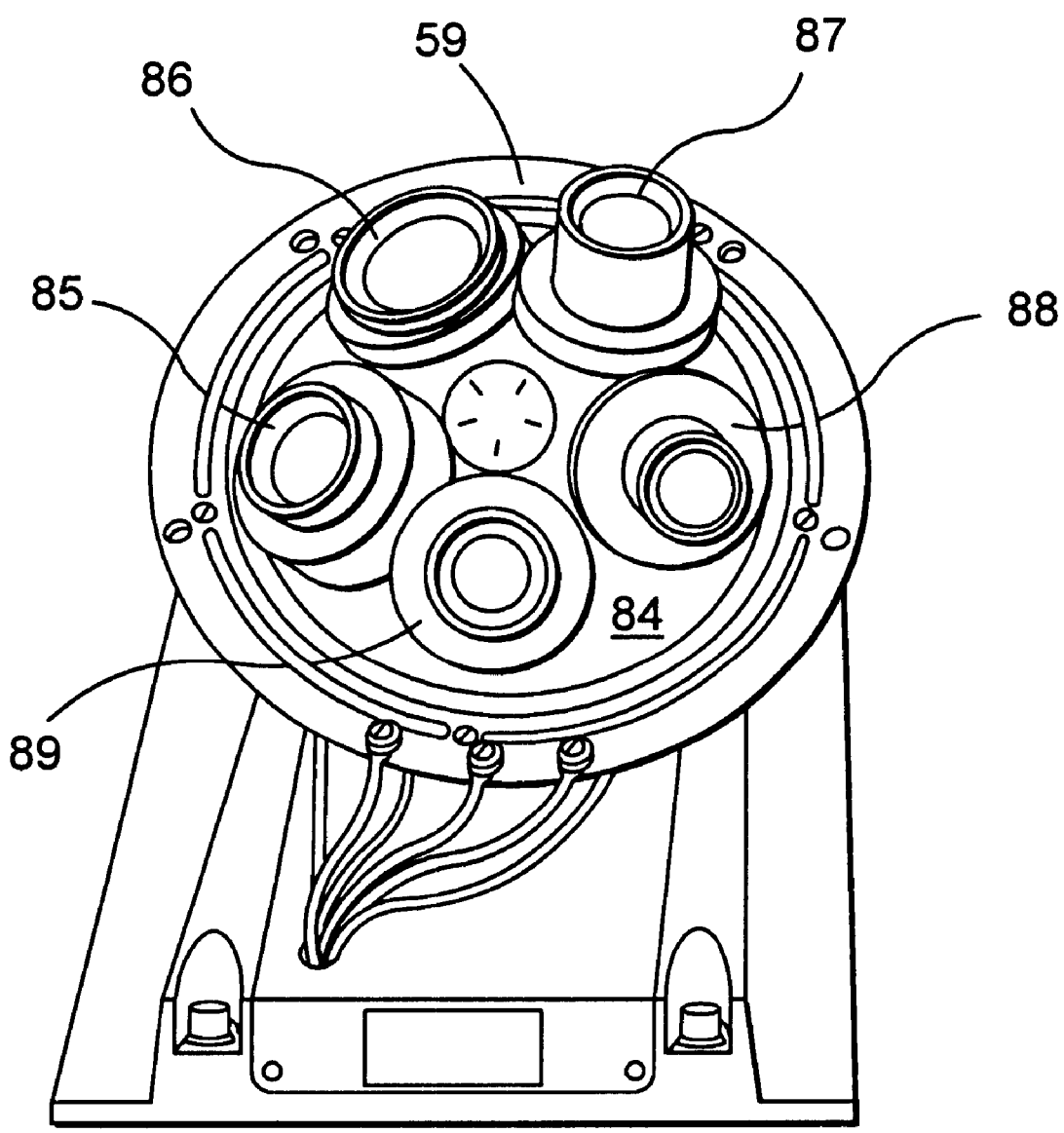
F I G. 16

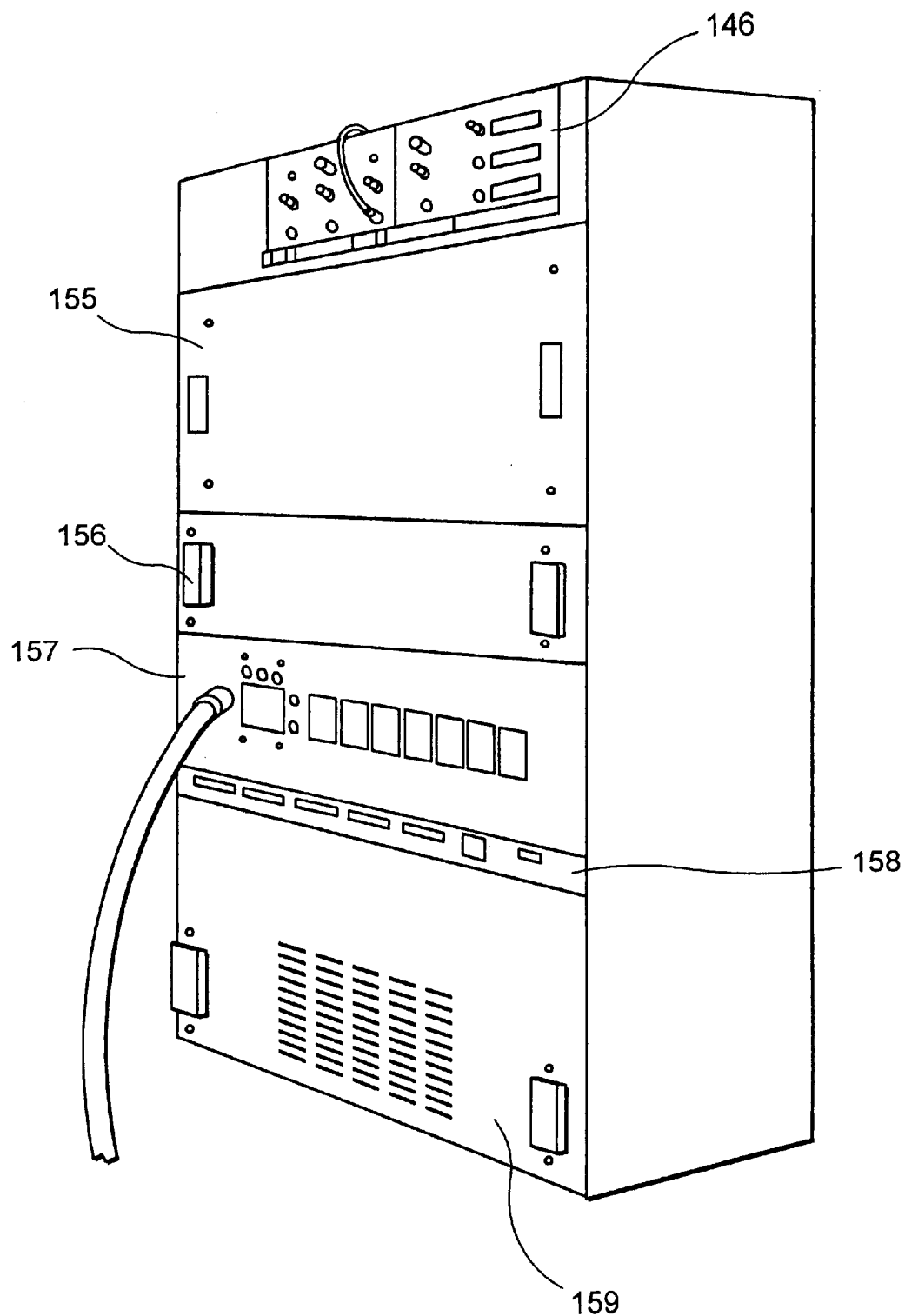
F I G. 18

LASER DELIVERY SYSTEM AND METHOD FOR PHOTOLITHOGRAPHIC MASK REPAIR

BACKGROUND OF THE INVENTION

The present invention relates generally to laser systems and, more particularly, to a system and method for surface particle and thin film ablation.

In the production of integrated circuits, for instance, an image of a photo-mask is first projected onto a photoresist material or layer coated on a silicon wafer or the like. This is commonly known as the exposure step. The photo-mask contains pattern information corresponding to the structures required for the circuit to operate. A result of this step is selective modification of the resist layer into a pattern that corresponds to the master pattern on the photo-mask. Subsequent process steps are then used to selectively modify the wafer as well as generate a circuit layer corresponding an the mask image impressed upon the resist. By repeating this process on the wafer using a series of masks, an integrated circuit is constructed.

With the ever increasing miniaturization of integrated circuitry and, in particular, reduction in size of photo-mask features, there is a continuing need for further refinement of photolithographic processing. To this end, it is desirable to expand the capabilities of traditional microscope components not only for enhanced viewing, but also analysis and correction of defects on photolithographic masks.

Conventional photo-mask patterns are generated by laser or electron beam direct writing. In particular, a blank mask coated with a resist material is scanned by a laser or electron beam. The beam is modulated, on or off, to expose or not expose, respectively, the material at each point in the scan raster. When scanning or writing has been completed, the material is developed. Stated differently, where ever beam exposed resist material is present, it is removed by chemical action. This leaves behind an image in the resist of the pattern desired to be transferred onto the photo-mask. The photo-mask is then etched using either a wet process, an acid bath or dry etching by RF excited plasma. Once etching has been completed, where ever resist material has been removed, chrome is also removed. Finally, the excess resist material is stripped away thereby producing, for instance, a "chrome on glass" photo-mask ready for inspection.

While this process has been found useful, image defects are often formed during photo-mask production. These defects are generally known as (i) misplaced pattern defects, (ii) missing pattern defects, and (iii) foreign material or contamination defects.

Generally speaking, misplaced pattern defects are spots of material, e.g., native material, that the patterning process was unsuccessful in removing from the substrate. These defects are classified and named according to their effect on the mask pattern, i.e., as isolated spots, edge extensions and bridge defects.

Missing pattern defects, in turn, typically manifest as spots where native material has been removed unintentionally from the substrate. These defects are classified according to their appearance, namely, as pinholes, edge intrusions and broken line defects.

As for contamination defects or FM, they are classified as any material-type contamination found on the mask surface. While rigorous cleaning and handling procedures may be applied, FM defects usually remain. Moreover, the cleaning processes eventually become victims of diminishing returns, that is, additional cleaning cycles of a photo-mask used to remove one FM defect will often add new ones.

In general, there is an inverse relationship between defect density and defect size, namely, as defect density increases, the size of the defect decreases. Although relatively smaller sized defects have been considered acceptable by some, with the ever increasing demand for smaller and faster devices, there is a corresponding decreasing tolerance for the minutest of defects.

An apparatus and localized laser method is therefore desired for viewing, analyzing and eliminating relatively small defects on photolithographic masks including, but not limited to, misplaced pattern, and foreign material defects.

SUMMARY OF THE INVENTION

In accordance with one aspect of the present invention is a system for photolithographic mask repair, which comprises:

a structure for supporting a mask to be operated on;

a laser emitting device for effecting mask repair;

a light source adjacent to the support structure for selected illumination of the mask;

a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair;

a computer device for controlling the sequential angular manipulation so as to capture a generally complete waveform of the beam and generate uniform surface exposure in the target area; and a microscope for multi-aspect viewing of the mask during navigation of the beam about the mask.

According to another aspect of the present invention is a system for photolithographic mask repair which comprises:

a structure for supporting a mask to be operated on;

a laser emitting device for effecting mask repair;

a light source adjacent to the support structure for selected illumination of the mask;

a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair;

a computer device for controlling the sequential angular manipulation so as to capture a generally complete waveform of the beam and generate uniform surface exposure in the target area; and a microscope for multi-aspect viewing of the mask during navigation of the beam about the mask, the computer device, simultaneously with manipulation of the beam, effecting fine motion control of the beam, controlled movement of a motorized aperture for effecting the sequential angular manipulation, controlled support structure movement, and image data processing.

In accordance with a further aspect of the present invention is a system for photolithographic mask repair which comprises:

a structure for supporting a mask to be operated on;

a laser emitting device for effecting mask repair;

a light source adjacent to the support structure for selected illumination of the mask;

a laser processor for effecting sequential angular manipulation of a laser beam projecting from the laser emitting device;

a computer device for controlling the sequential angular manipulation so as to capture a generally complete waveform of the beam and generate uniform surface exposure in the target area; and a microscope for multi-aspect viewing of the mask during navigation of the beam about the mask, the microscope including a relatively low magnification video camera, a relatively high magnification video camera, and a DUV imaging and transmission measurement system.

According to yet another aspect of the present invention is a system for photolithographic mask repair which comprises:

a structure for supporting a mask to be operated on;

a laser emitting device for effecting mask repair;

a light source adjacent to the support structure for selected illumination of the mask;

a laser processor for effecting sequential angular manipulation of a laser beam projecting from the laser emitting device;

a computer device for controlling the sequential angular manipulation so as to capture a generally complete waveform of the beam and generate uniform surface exposure in the target area; and a microscope for multi-aspect viewing of the mask during navigation of the beam about the mask.

According to still another aspect of the present invention is a system for photolithographic mask repair which comprises:

a mask to be operated on;

a laser emitting device;

a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair;

a computer device for controlling the sequential angular manipulation so as to capture a generally complete waveform of the beam and generate uniform surface exposure in the target area; and a microscope for multi-aspect viewing of the mask during navigation of the beam about the mask.

According to yet a further aspect of the present invention is a system for photolithographic mask repair which comprises a mask to be operated on, a laser emitting device, and a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair.

Another embodiment of the present invention relates to a method for photolithographic mask repair comprising the steps of:

i. locating a photo-mask on a relatively stationary, isolated support structure;

ii. activating a laser emitting device for effecting mask repair;

iii. actuating a light source adjacent to the support structure for selected illumination of the mask;

iv. passing a laser beam emitted from the laser emitting device through a laser processor for effecting sequential angular manipulation of the laser beam, the processor including an adjustable beam splitter for effecting off-axis illumination of the laser beam, a motorized aperture for facilitating incremental mask repair, an optical system for image reduction, and a device for viewing the mask during repair;

v. controlling the sequential angular manipulation so as to capture a generally complete waveform of the beam and generate uniform surface exposure in the target area; and vi. simultaneously with the sequential angular manipulation, providing multi-aspect viewing of the mask during navigation of the beam about the mask, effecting fine motion control of the beam, controlled movement of the motorized aperture for effecting the sequential angular manipulation, controlled support structure movement, and image data processing.

A further embodiment according to the present invention is a method for photolithographic mask repair comprising the steps of:

i. activating a laser emitting device for effecting mask repair;

ii. locating a photo-mask on a relatively stationary, isolated support structure;

iii. actuating a light source adjacent to the support structure for selected illumination of the mask;

iv. passing a laser beam emitted from the laser emitting device through a laser processor for effecting sequential angular manipulation of the laser beam, the processor including an adjustable beam splitter for effecting off-axis illumination of the laser beam, a motorized aperture for facilitating incremental mask repair, an optical system for image reduction, and a device for viewing the mask during repair;

v. controlling the sequential angular manipulation so as to capture a generally complete waveform of the beam and generate a more uniform surface exposure in the target area; and vi. simultaneously with the sequential angular manipulation, providing multi-aspect viewing of the mask during navigation of the beam about the mask, effecting fine motion control of the beam, controlled movement of the motorized aperture for effecting the sequential angular manipulation, controlled support structure movement, and image data processing.

Still another embodiment of the present invention relates to a method for photolithographic mask repair comprising the steps of:

i. activating a laser emitting device for effecting mask repair;

ii. actuating a light source adjacent to the support structure for selected illumination of the mask;

iii. locating a photo-mask on a relatively stationary, isolated support structure;

iv. passing a laser beam emitted from the laser emitting device through a laser processor for effecting sequential angular manipulation of the laser beam, the processor including an adjustable beam splitter for effecting off-axis illumination of the laser beam, a motorized aperture for facilitating incremental mask repair, an optical system for image reduction, and a device for viewing the mask during repair;

v. controlling the sequential angular manipulation so as to capture a generally complete waveform of the beam and generate a more uniform surface exposure in the target area; and vi. simultaneously with the sequential angular manipulation, providing multi-aspect viewing of the mask during navigation of the beam about the mask, effecting fine motion control of the beam, controlled movement of the motorized aperture for effecting the sequential angular manipulation, controlled support structure movement, and image data processing.

Accordingly, it is an object of the present invention to provide an improved system and method for photolithographic mask repair.

Another object of the present invention is to provide improved precision in photolithographic mask repair.

A further object of the present invention is to enhance resolution of a laser beam used for photolithographic mask repair.

Yet another object of the present invention is to provide a system for viewing, analyzing and eliminating surface defects from photolithographic masks.

Still another object of the present invention is to provide a system for real time viewing of a photolithographic mask during mask repair.

Yet a further object of the present invention is to provide a system for multi-aspect viewing of and navigation about a photolithographic mask.

A further object of the present invention is to provide a method for loading photo-masks of varying thicknesses while preserving top reference.

Still another object of the present invention is to provide illumination suitable for concurrently viewing patterns on, and laser repair of, photolithographic masks.

Another object of the present invention is to provide a system for improving and controlling images of photolithographic masks presented to a user by varying image magnification, illumination wavelength, illumination angle and/or polarization.

Yet another object of the present invention is to improve defect viewing of photolithographic masks using off-axis laser illumination.

Still a further object of the present invention is to provide repeatable control of the photolithographic mask, defect repair process using machine vision.

A further object of the present invention is to provide a system for photolithographic mask repair with an actuating focusing mechanism without backlash and auto-focusing.

Another object of the present invention is to improve selectivity of a laser machining process to preferentially remove opaque films from glass substrates, and foreign material from photo-masks.

Yet a further object of the present invention is to provide for the elimination of opaque defects and foreign material on peliclized photo-masks, and the deposition of removed material in the neighborhood of photo-mask repair.

The present invention will now be further described by reference to the following drawings which are not intended to limit the accompanying claims.

BRIEF DESCRIPTION OF THE DRAWINGS

FIG. 6A is a schematic of part II of the device set forth in FIG. 6;

FIG. 16 is a bottom view of the assembly set forth in FIG. 15 showing the microscope turret and nosepiece assembly;

FIG. 18 is a rear perspective view of the control system of FIG. 17; and

The same numerals are used throughout the figure drawings to designate similar elements. Still other objects and advantages of the present invention will become apparent from the following description of the preferred embodiments.

DETAILED DESCRIPTION OF THE PREFERRED EMBODIMENTS

Figure 1:
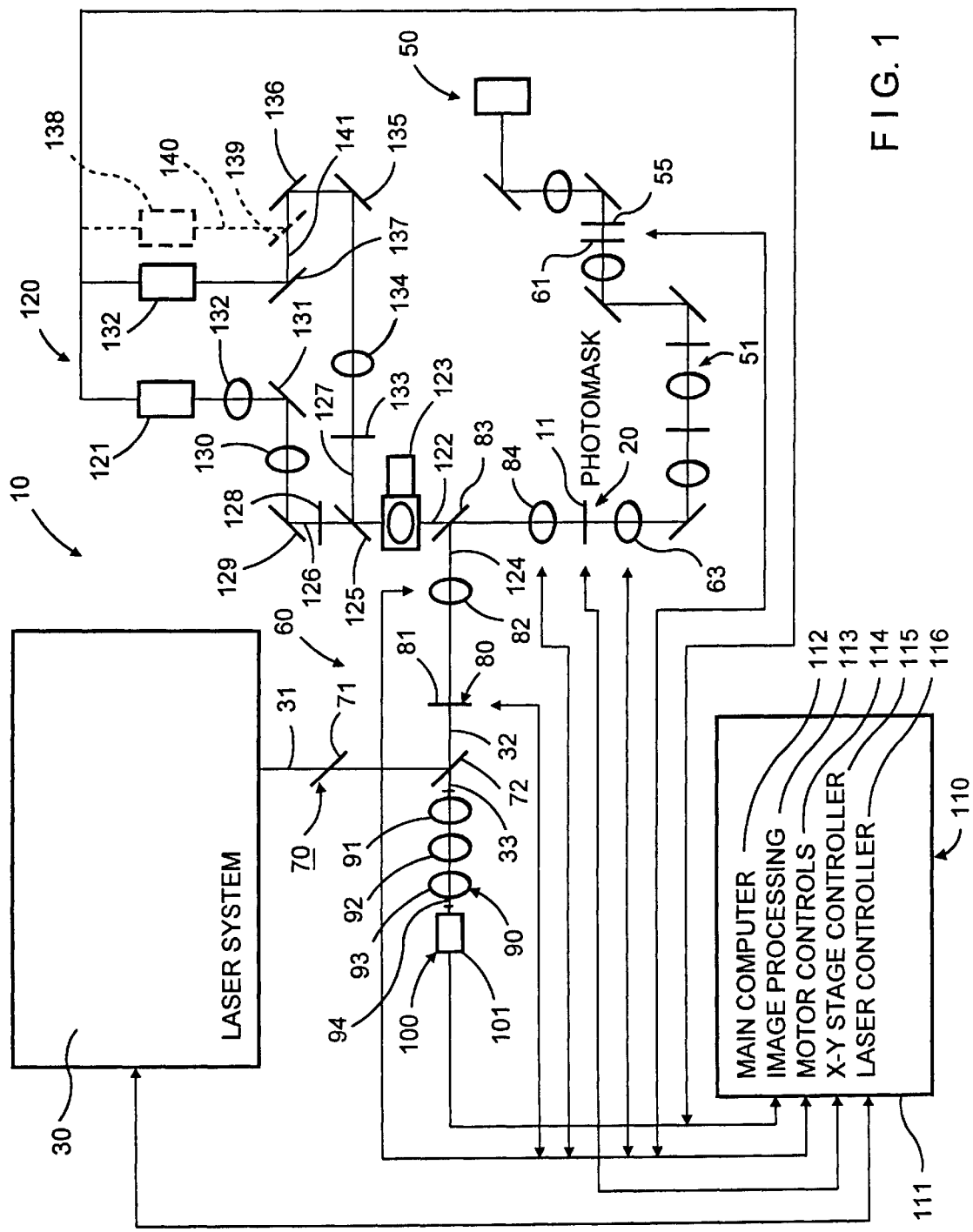
FIG. 1 is a schematic showing a system and method for photolithographic mask repair according to one aspect of the present invention.

Referring now to the drawings and, more particularly, to FIGS. 1–19, there is shown generally a specific, illustrative laser delivery system 10 and method for photolithographic mask repair according to various aspects of the present invention. As shown in FIG. 1, the system comprises a stage system 20 for supporting a photo-mask 11 to be operated on, a laser emitting device 30 for effecting mask repair, and a light source 50 adjacent the support structure for selected illumination of the mask. A laser beam processor 60 effects sequential angular manipulation of a laser beam 31 projecting from the laser emitting device. The processor includes an adjustable beam splitter 70 for effecting off-axis laser illumination, a motorized aperture assembly 80 for facilitating incremental mask repair, an optical system 90 for image magnification, and a device 100 for viewing the mask during repair.

A computer device 110 controls the sequential angular manipulation so as to capture a generally complete waveform of the beam and generate more uniform surface exposure in the target area. Computer device 110, simultaneously with manipulation of the beam, also effects fine motion control of the beam, controlled movement of the motorized aperture for effecting the sequential angular manipulation, controlled movement of the support structure, and image data processing. A microscope 120 provides multi-aspect viewing of the mask during navigation of the beam about the mask.

Generally speaking, a source of coherent monochromatic light is needed to create a diffraction pattern upon transmission through an aperture. Conventional microscopes used in optical imaging systems, however, collect only a fraction of the light. To achieve optimal viewing, the diffraction pattern must be created or converted completely to an image of the aperture. In this connection, the higher the order of diffraction, the higher the number of spatial frequency components it contains. Hence, the quality of the image is governed principally by how large a fraction of the diffraction pattern, i.e., the number of fringes, that are collected.

Figure 2:
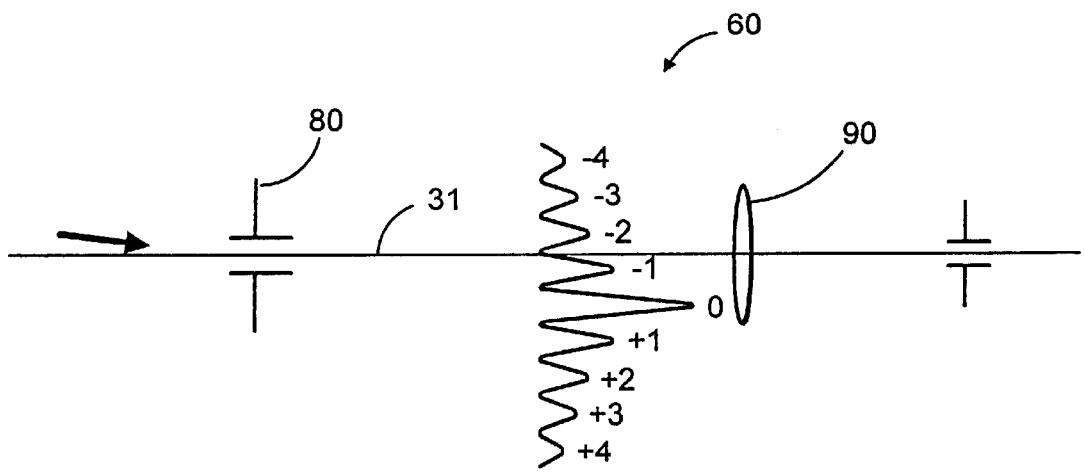
FIG. 2 is a schematic illustrating a selected laser beam intensity profile resulting from diffraction upon passage of the beam through an aperture produced in accordance with the system set forth in FIG. 1.
Figure 3:
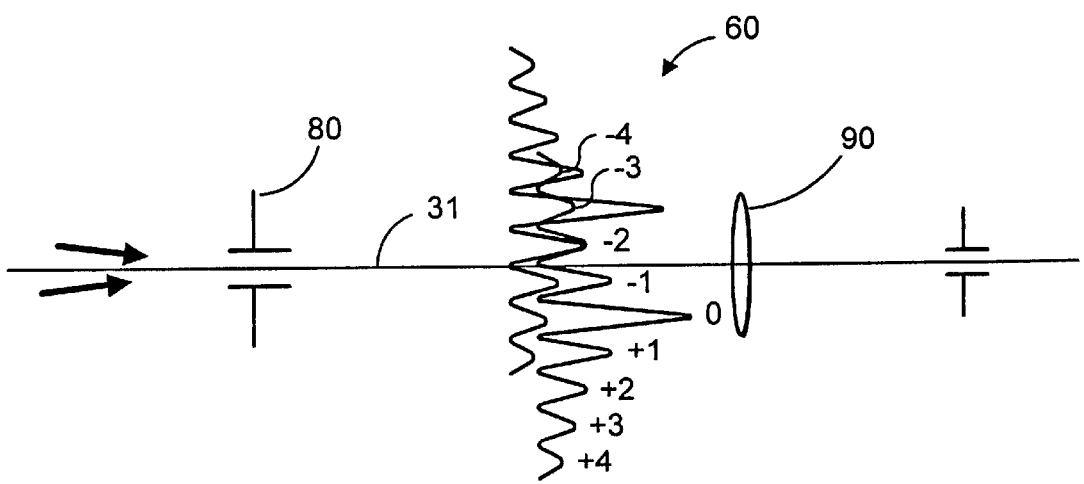
FIG. 3 is a schematic illustrating multiple laser beam intensity profiles resulting from diffraction upon passage of the beams through an aperture produced in accordance with the system set forth in FIG. 1.

As illustrated in FIGS. 2–3, the present invention provides a revolutionary illumination scheme whereby beam processor 60 integrates a series of sequential angular shots of laser beam 31 (and the corresponding waveform of each beam) into a single composite image at the photo-mask. This results in drastic improvement in uniformity of the aperture image, not only increasing the accuracy to scale of photo-mask repair but also accuracy of the image projected onto the photo-mask.

Figure 4:
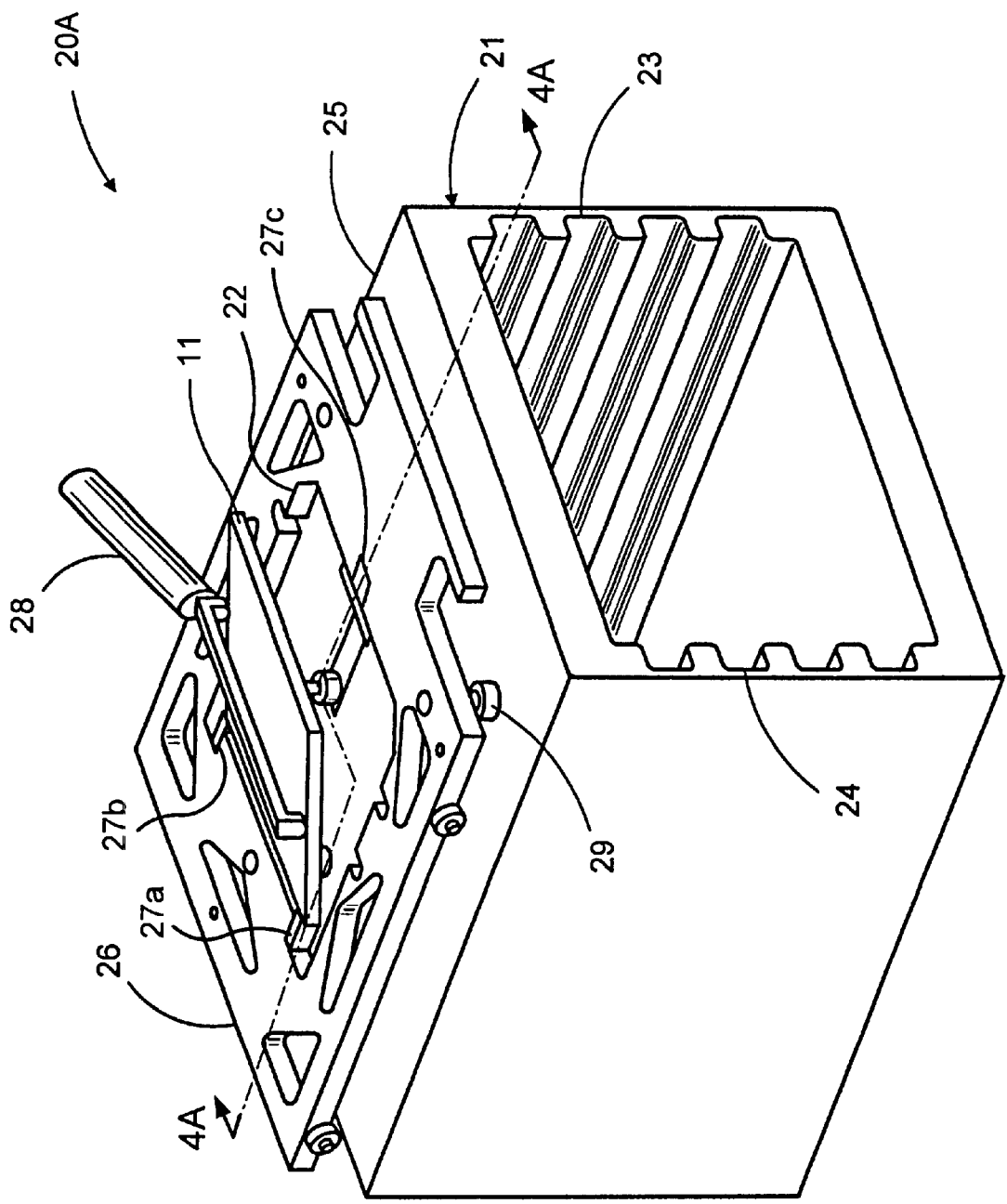
FIG. 4 is a perspective view of a stage system for holding a photo-mask with load station and cassette according to one aspect of the present invention.
Figure 5:
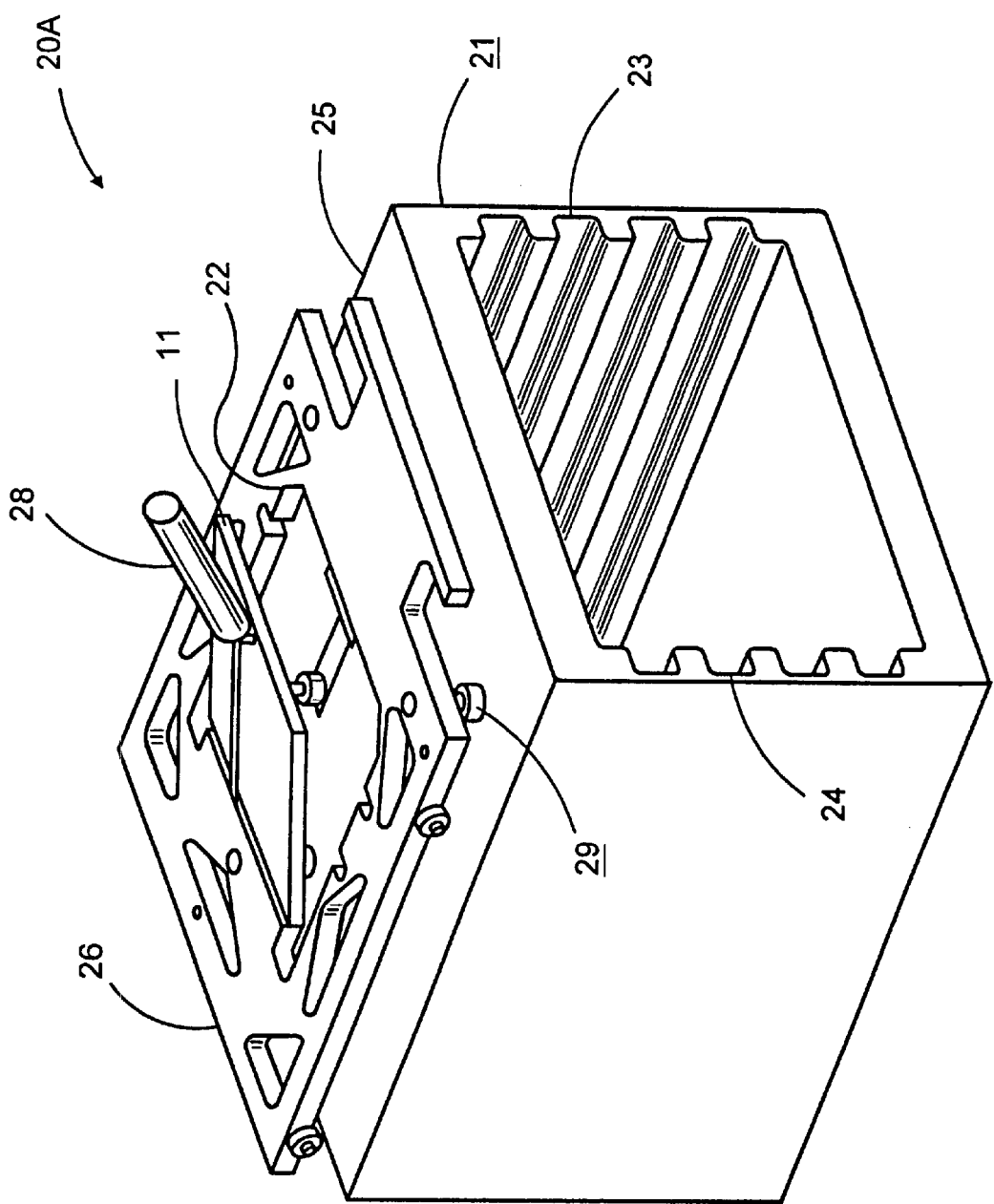
FIG. 5 is a perspective view of a stage system for holding a photo-mask with load station and cassette according to another aspect of the present invention.

Turning now to operative components of the present invention, as shown generally in FIGS. 4 and 5, the mask loading station 20A includes a three dimensional, open front-ended box-like structure 21. The structure interior is formed with horizontally disposed rails 23, 24 on opposing side walls thereof for slidably receiving, holding and storing photo-mask holders or cassettes 26 when not in use. Suspended over top 25 of the structure is a cassette 26 with mask receiving station 22 used for repeatedly loading photo-masks 11 onto the system while preserving top reference.

Figure 4A:
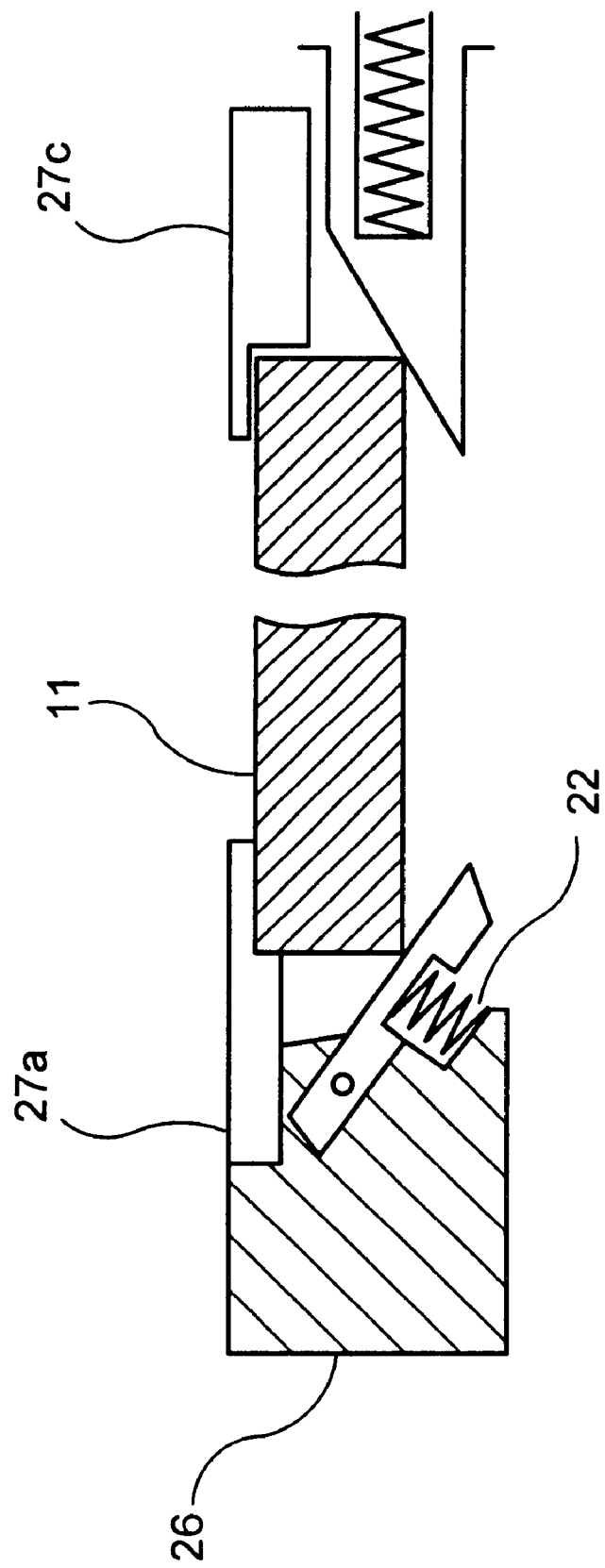
FIG. 4A is a sectional view taken along offset line A—A of FIG. 4 showing tab, lift-spring and latch assemblies upon loading the cassette.

Using a removable "pick" 28, each photo-mask is placed on the cassette and secured thereto for repair. Specifically, as best seen in FIG. 4A, upon engagement of an edge of the photo-mask with tab and lift-spring arrangements 27a, 27b at corners of the mask receiving station, and of a latch assembly 27c centrally located on the opposing side edge of the photo-mask, photolithographic repair may be effected. The structure top is preferably constructed of a hard, heavy, dense material with exceptional damping qualities, e.g., granite, to minimize vibration and other mechanical interference during operation.

Figure 5A:
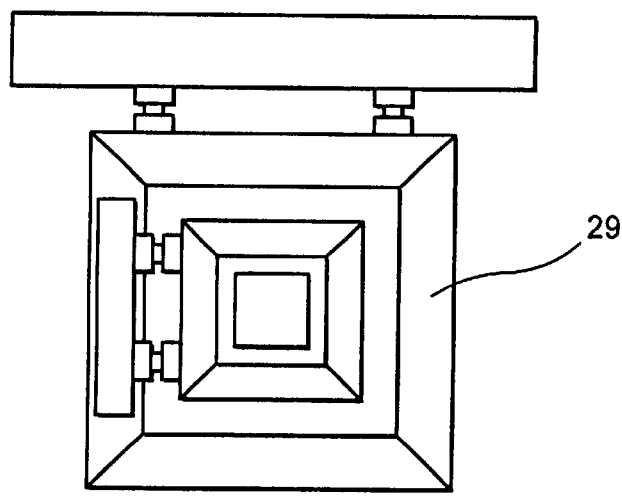
FIG. 5A is a schematic plan view of a stage brake for the stage system illustrated in FIG. 5.

As best seen in FIG. 5A, an air brake arrangement or stage brake system 29 is provided between the structure top and the cassette for engaging or disengaging the cassette from the structure. Upon engagement, a solid, stationary platform is created for mounting laser sources, laser processing optics, a microscope, a substage illuminator, and a photo-mask. This platform insures minimal interference due to vibration during photo-mask viewing and repair.

Figure 5B:
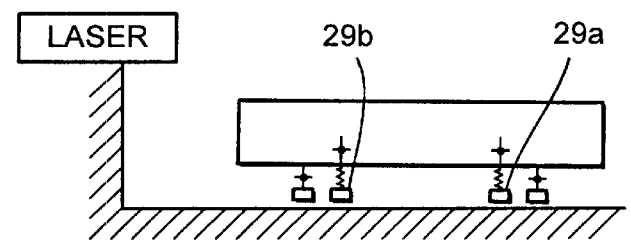
FIG. 5B is a schematic side view showing the stage brake of FIG. 5A in a stowed position.
Figure 5C:
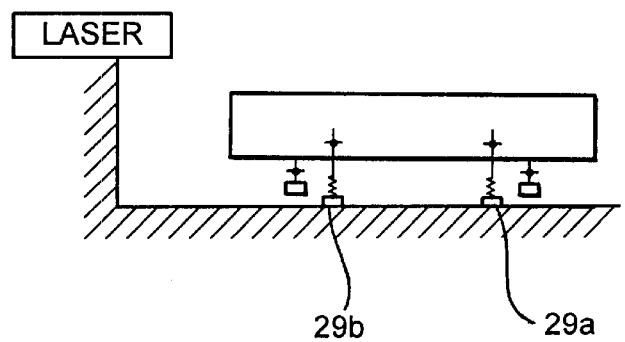
FIG. 5C is a schematic side view showing the stage brake of FIG. 5A in an operative position.

In a stowed position, as shown in FIG. 5B, the cassette is disengaged from the stage structure. Stage brakes 29a, 29b and the servo are in an "OFF" position, the structure preferably maintaining its position by mechanical interference, e.g., friction forces. When the cassette is in the operative position, on the other hand, the brakes are "ON" and the cassette is engaged with the structure. This is illustrated generally in FIG. 5C. The stage structure desirably holds the cassette in position by servo action. As indicated in both FIGS. 5B and 5C, for optimal imaging, it is preferred that the laser and imaging system, according to the present invention, be located a selected distance above the photo-mask surface and cassette.

Figure 6:
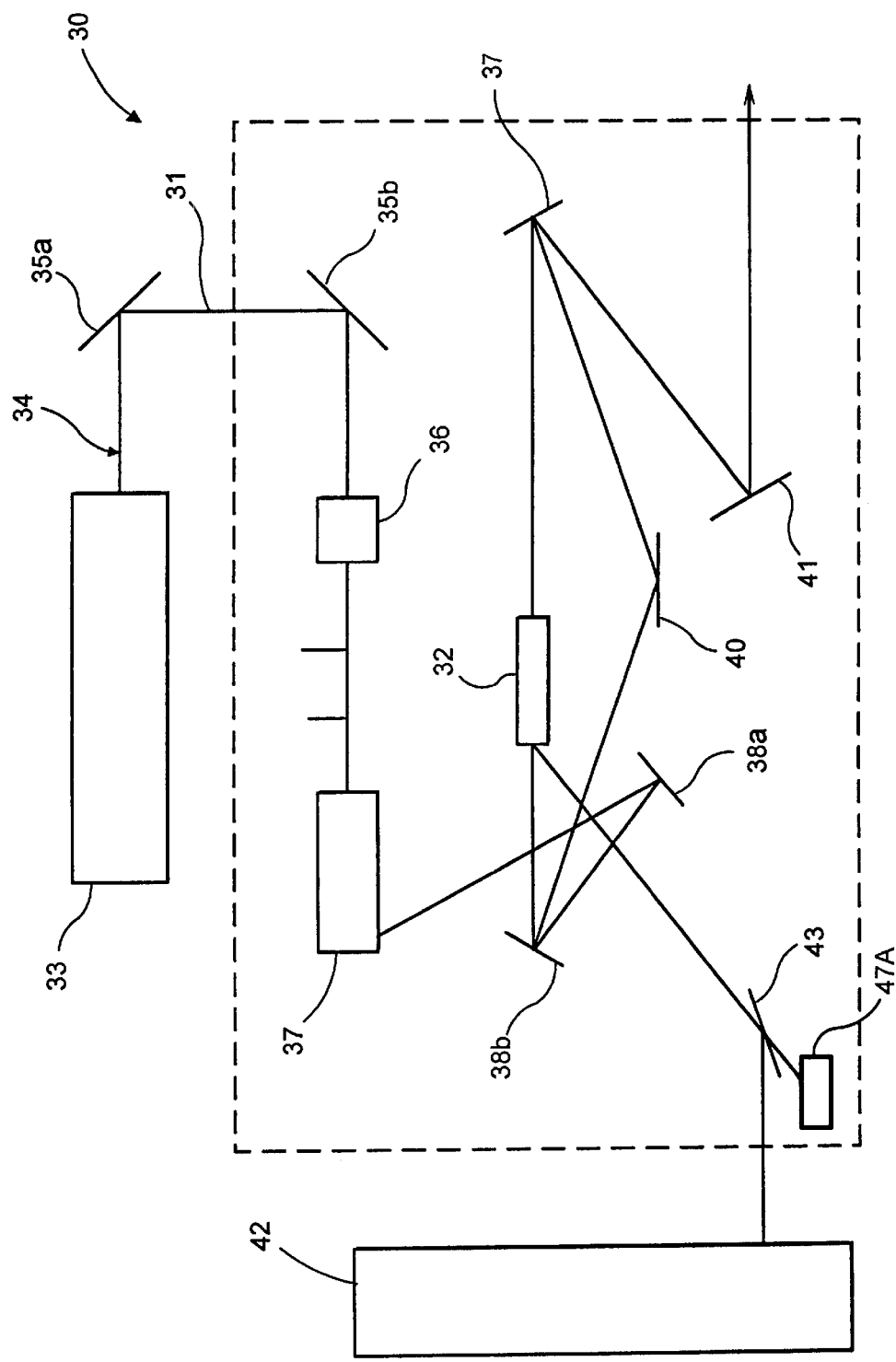
FIG. 6 is a schematic of part I of a laser emitting device according to one aspect of the present invention.

Referring now to FIG. 6, laser emitting device 30 preferably includes a conventional industrial laser system 31 with amplified titanium sapphire or Ti:S laser 32. According to one aspect of the present invention, system 31 comprises an oscillator 33 operating at about 82 MHz and about a 100 femtosecond pulse. The oscillator emits signals 34 which are directed by a pair of first turning mirrors 35a, 35b to a pulse selector 36 for selecting a suitable pulse rate. The signal then passes through an optical pulse stretcher 37 which effectively stretches the duration of each pulse. Thereafter, the signal is directed by second turning mirrors 38a, 38b through Ti:S laser 32 and, in turn, directed by third turning mirror 39, a multipass amplifier 40, back to second turning mirror 38b, through the Ti:S source, and so forth. When sufficiently amplified, a fourth turning mirror 41 directs the laser beam to laser beam pulse compressor 42.

As shown in FIG. 6A, after passing through the beam pulse compressor, the beam is angled by a turning mirror and passes, in succession, through a motorized ½ wave plate 43 and an LBO for second harmonic generation 44, e.g., $\lambda_1$ 800 nm to $\lambda_2$ 400 nm. The beam then passes through a beam splitter/harmonic separator 45. Thereafter, the beam component directed by the beam splitter engages a beam splitter 46 providing about a 50% reduction in beam intensity. Finally, the component directed by beam splitter 46 arrives at its destination, SHG-output energy meter 47c. As for the split component of the beam that passes through beam splitter 45, it arrives at an amplifier energy meter 47b. The split component of the beam passing through beam splitter 46 is dissipated, as appropriate.

Alternatively or concurrently therewith, the laser emitting device includes a helium cadmium or He:Cd laser beam 48. Preferably, beam 48 is emitted by a device housed externally to the laser emitting device. Upon direction of the beam from turning mirror 38a to 38b, then to Ti:S laser 32, a first component of the beam passes through laser 32 as indicated above. A beam splitter adjacent to the laser's entrance causes a second beam component to be split off, i.e., prior to entry to the laser. The second component is then directed to a pump energy meter 47a positioned between the external device and the laser. In another alternative embodiment, a neodymium, yttrium aluminum garnet or Nd:Yag laser beam is utilized in a similar fashion, as will be appreciated by those skilled in the art.

Although the present invention is shown and described in connection with amplified Ti:S, He:Cd and Nd:Yag lasers, it will be appreciated that other high intensity, monochromatic light sources may be used, giving consideration to the purpose for which the present invention is intended. In addition, harmonics of these fundamental lasers are considered to be within the spirit and scope of the present invention.

Figure 7:
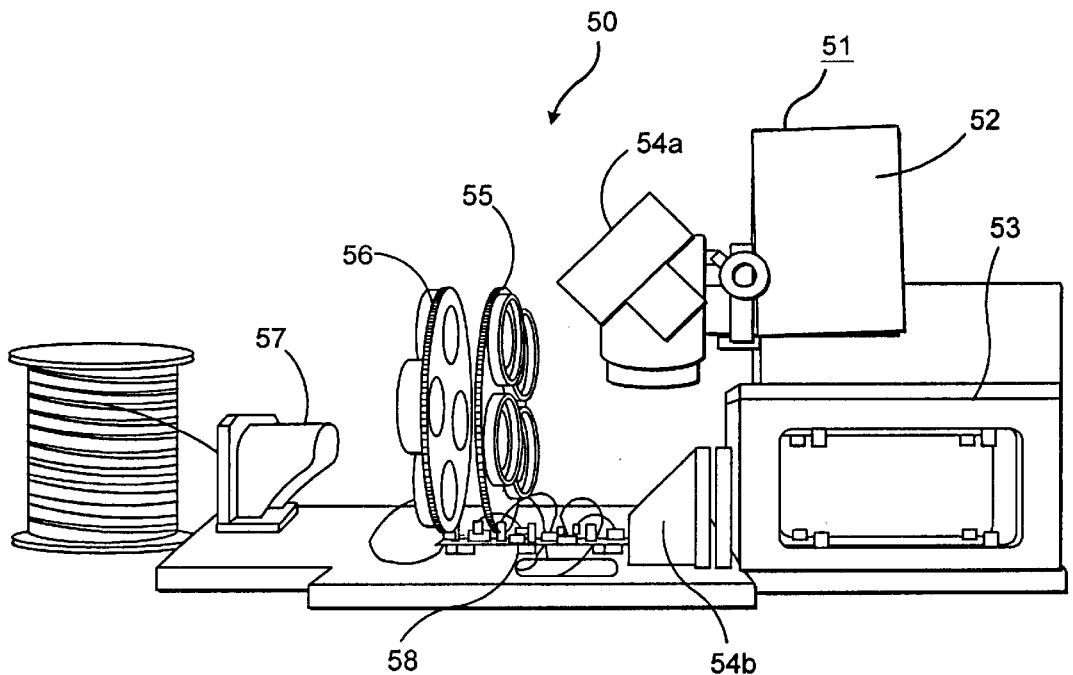
FIG. 7 is a side view of a substage illuminator in accordance with the present invention.
Figure 8:
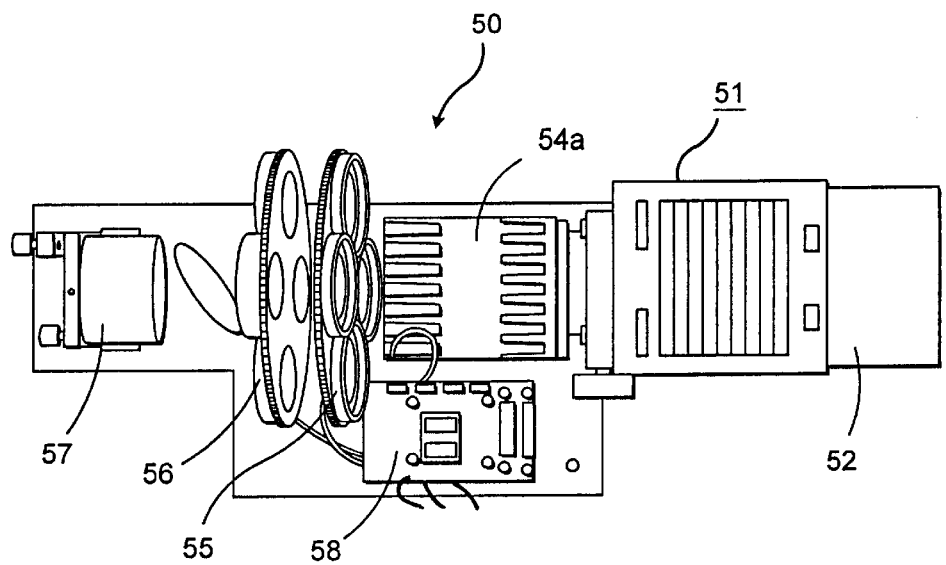
FIG. 8 is a plan view of the substage illuminator shown in FIG. 7.

Turning now to light source 50, a substage illuminator 51 is preferably provided adjacent to but beneath stage system 20 for selected illumination of photo-mask 11. An apparatus of this general description is shown generally in FIGS. 1, 7 and 8. As best seen in FIGS. 7 and 8, a lamp house 52 mounted atop a support structure 53 serves as the light source. Turning mirrors 54a, 54b, also mounted to structure 53, direct light emitted from the lamp house through an attenuator 55, a wavelength selector 56, and then to a turning mirror 57 which directs and positions the light for desired illumination of the photo-mask. Circuit board 58 permits control of the degree of illumination, the extent of attenuation, the wavelength selected, and positioning of turning mirror 57. The substage illuminator, as generally described above, is known as a Koehler illuminator and is considered conventional.

As shown in FIG. 1, it is also desired that the substage illuminator be provided with a series of narrow line width optical filters 61, e.g., four, installed in a motorized selector 62 for selecting illumination wavelength from a spectrum of light, for example, light provided by a mercury xenon or HgXe arc lamp. A substage condenser 63 provides transmitted illumination. The condenser is mounted to a movable stage that translates generally in a vertical direction, i.e., along the optical axis. This allows variation in the intensity of illumination collected by the microscope system as well as in the cone angle of illumination.

While the present invention is shown and described as utilizing a Koehler illuminator, it is understood that other illumination apparatus may be utilized giving consideration to the purpose for which the present invention is intended.

Figure 9:
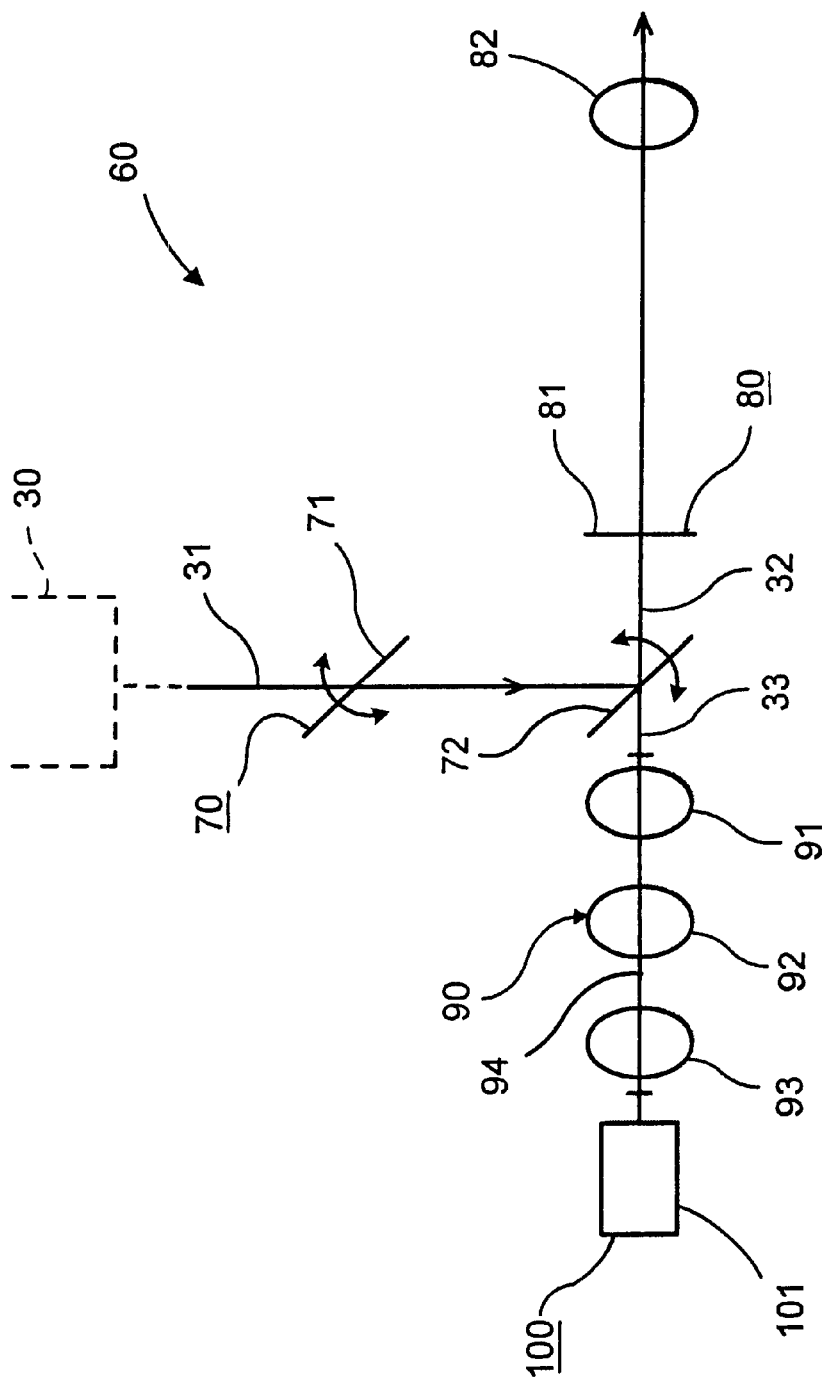
FIG. 9 is a schematic showing a laser beam processor in accordance with the present invention.

As set forth in FIG. 9, laser beam processor 60 effects sequential angular manipulation of the laser beam projecting from laser emitting device 30. The beam processor again includes an adjustable beam splitter 70 for effecting off-axis laser illumination, a motorized aperture 80 for facilitating incremental mask repair, an optical system 90 for image magnification, and a device 100 for viewing the mask during repair.

At the kernel of the present invention is beam splitter 70 which receives laser beam 31 from the laser emitting device. The beam splitter comprises a first processor turning mirror 71 such as a "leaky" mirror, e.g., a three dimensional, adjustable, tilting, partial reflecting mirror or a piece of polished glass. This mirror desirably allows 99.9999% of the light through. An objective is to put a "wiggle" in the laser beam and thereby create the requisite offset for sequential angular manipulation.

Figure 13:
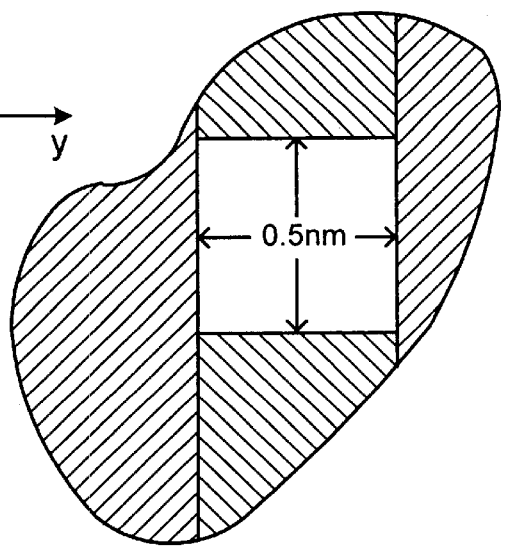
FIG. 13 is a sectional view of the aperture shown in FIG. 12 in a clear area or full open position.
Figure 12:
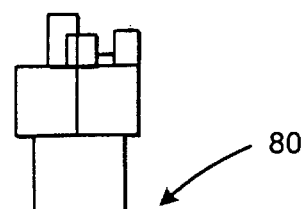
FIG. 12 is a plan view of the assembly shown in FIG. 11 with the front plate and PCB assembly removed.
Figure 12:
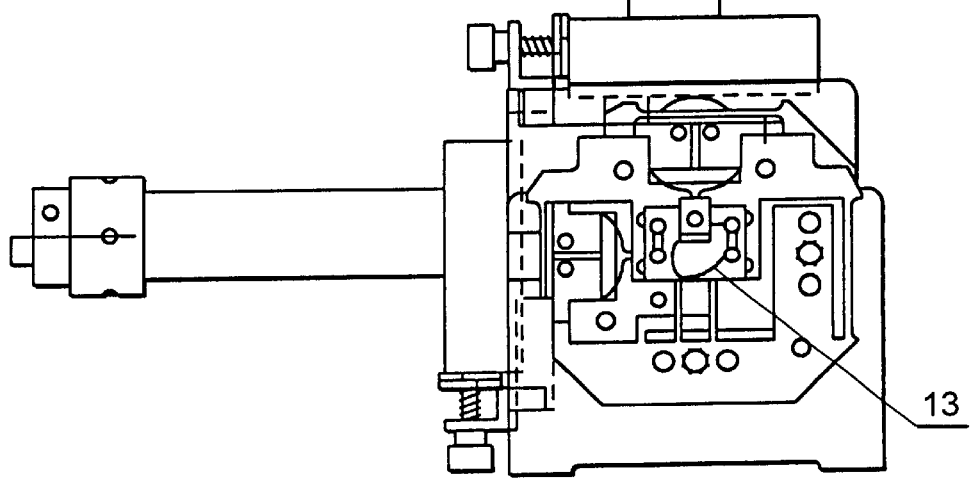

The light passing through mirror 71 is directed to a second beam splitter or adjustable processor turning mirror 72, which is also preferably a "leaky" mirror. Mirror 72 is preferably at a selected, fixed position during operation so as to direct a first split 32 of the laser beam through motorized aperture assembly 80. Principal beam processing functions, notably incremental mask repair, is effected by the aperture assembly. As shown in FIGS. 1 and 11–13, beam 32 first passes through an aperture 81 of the assembly, then a lens 82 for image reduction. The aperture, as illustrated in FIG. 13, is in an operative or full open position. Lens 82 has a corresponding focal length, e.g., of about 200 mm. Thereafter, the beam engages a beam splitter 83 which directs the same generally in a downward direction.

The foregoing arrangement is particularly advantageous for effecting precise movement of the laser beam to a desired target area, namely, the photo-mask. The projected image of the laser-illuminated aperture is moved within the field of view of the microscope objective by translating the relay lens in directions generally perpendicular to beam propagation (hereinafter "fine beam motion"). Fine beam motion provides increased accuracy, precision and resolution since the translated lens operates before magnification and while the brakes are engaged. Relatively large movements of the lens system are then required in order to make small changes in beam position.

Figure 15:
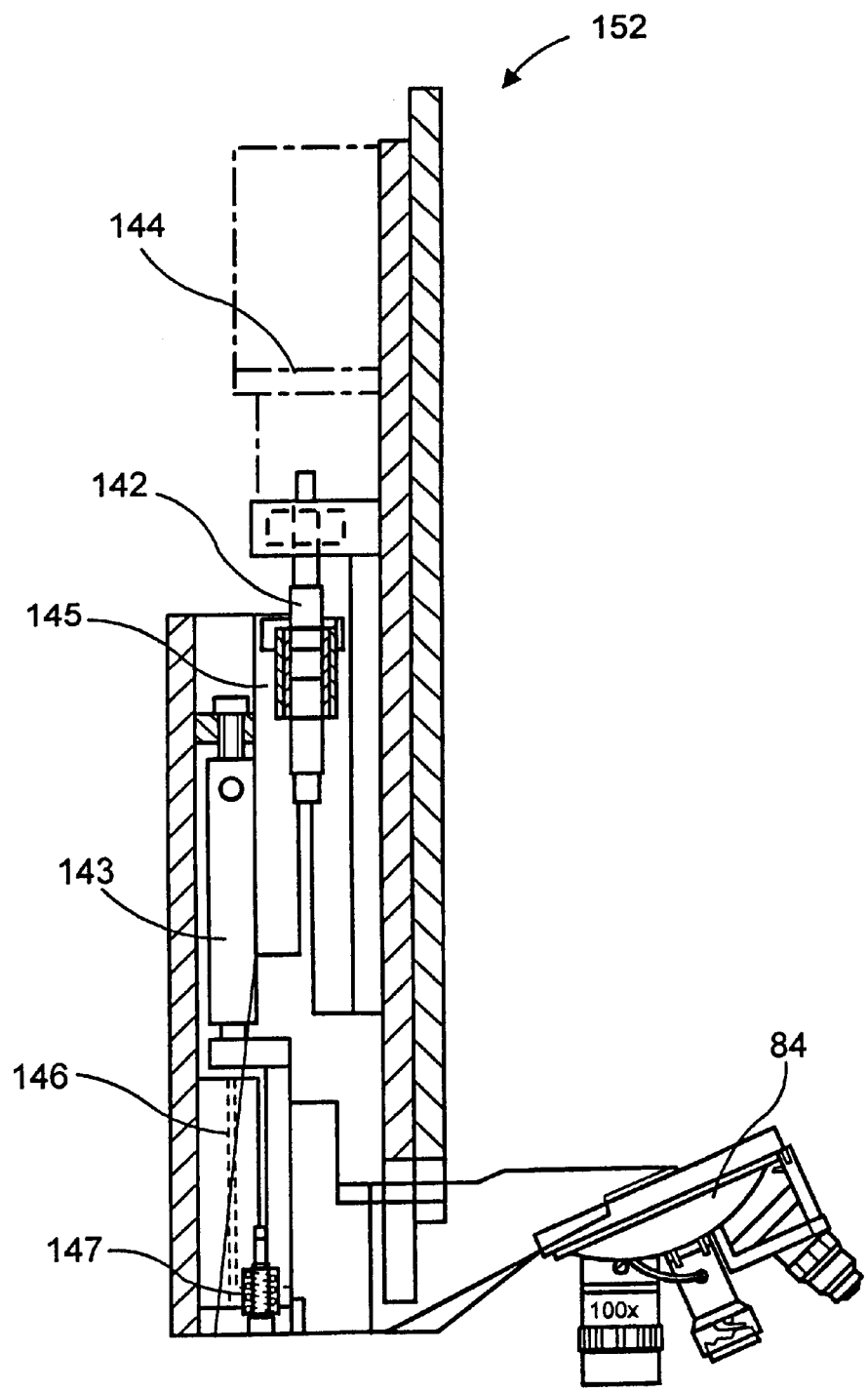
FIG. 15 is a schematic, sectional view of the anti-backlash z-column of FIG. 14 illustrating the microscope nosepiece assembly.

Next, the beam next passes through a selected lens or objective 84, namely objective 85, 86, 87, 88 or 89. According to one aspect of the present invention, objectives 85–89 have a magnification of 5×, 10×, 40×, 50×, and 100×, respectively. As shown in FIGS. 15 and 16, these objectives are preferably mounted on a motorized nosepiece assembly or microscope turret 59 for selected motorized manipulation, specifically, for navigation about the photo-mask. Upon reduction, beam 32 is directed onto the photo-mask (or repair site) for photolithographic mask repair.

The present invention additionally facilitates homogenization of laser exposure in the repaired area. As laser beams are highly coherent sources of light, when used to illuminate an aperture, their coherence causes strong fringes or intensity fluctuations in the projected image. As a result, the laser dose is varied across the exposed area. To increase repair effectiveness, it is desirable to uniformly expose the repaired area.

Uniform exposure of the repaired area may be accomplished in two ways. First, as a train of repair pulses are fired, the angle or position of the laser beam incident the aperture is changed. This causes a modified fringe pattern to be generated by each pulse, the time averaged result of which is a more uniform exposed area. A second method of uniformly exposing this area is to change the aperture size as the train of repair pulses are fired. This also generates a modified fringe pattern for each pulse. To completely remove the defect, the size of the aperture is increased with the last pulse passing through the aperture.

Figure 10:
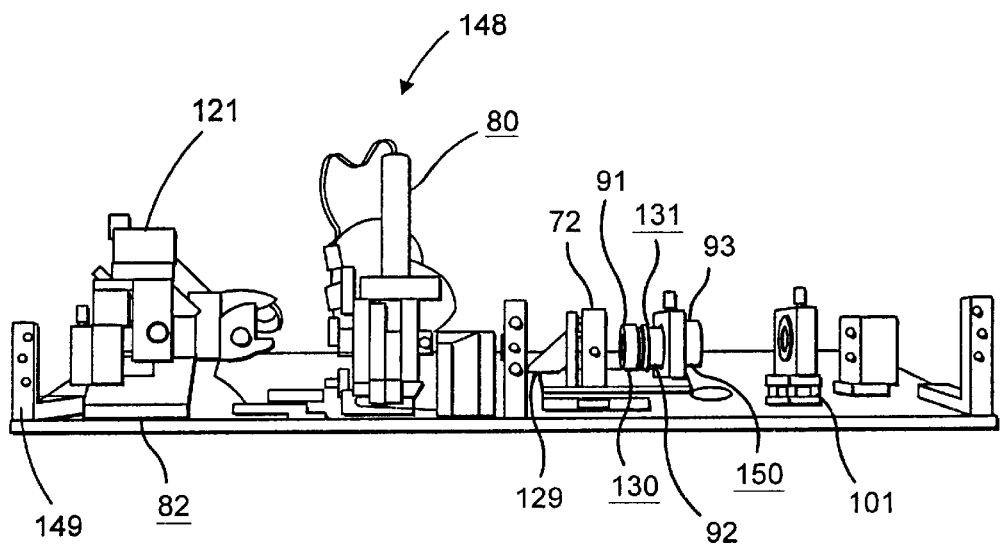
FIG. 10 is a side view of a microscope arm assembly according to the present invention.

The other or second beam 33 produced by beam splitter 72 instead passes back through an optical system 90 for image magnification. As shown in FIGS. 1, 9 and 10, the system comprises a series of lenses 91, 92, 93, each having a focal length of, e.g., about 30 mm. This arrangement provides rapid image magnification over a relatively short distance 94. Thereafter, a device 100 such as a spot marker illumination camera 101 or the like is used suitably to view the photo-mask during repair. Optical imaging and image processing functions of camera 101 are performed by computer device 110, as will be set forth in greater detail below.

Turning now to photo-mask operations, microscope 120, e.g., a video microscope, provides not only viewing but also analysis functions. According to one aspect of the present invention, as best seen in FIG. 1, the microscope has at least two and preferably three devices for observing, photographing, and analyzing the photo-mask during navigation. The first device or camera 121 is desirably a video camera of a standard, low magnitude, low resolution type, e.g., 640×480 liner. To this end, light from substage illuminator 51 passing up through the mask is collected with minimal loss through one of objectives 85–89. The light then passes through beam splitter 83. A first beam of light 122 diverted by the beam splitter is focused on passage through a reflected light illuminator relay lens assembly 123. A second beam 124, in turn, is directed back through lens 82, aperture 81, beam splitter 72, through lenses 91–93, and principally to device 101 for viewing the mask during repair.

Upon activation of first camera 121, the first beam is also divided by a beam splitter 125 into a third beam 126 and a fourth beam 127. The third beam is guided through field stop 128, then diverted by turning mirror 129 through lens 130. The lens has a selected focal length, e.g., of about 100 mm, for effecting gradual image magnification. After passing through lens 130, third beam 126 is directed via turning mirror 131 through another lens 132. This lens has a focal length generally less than lens 130, e.g., about 50 mm, so as to facilitate further image magnification. The resulting image may then be viewed by camera 121. Lenses 130, 132 are selected and adjusted suitably for imaging the objective's entire field of view.

When relatively high magnification, high resolution viewing is desired, a second device or camera 132 of the microscope is engaged. Upon activation, the fourth beam produced by beam splitter 125 is viewed alternatively to the third. In particular, the fourth beam (after leaving splitter 125) passes through field stop 133 and lens 134, respectively. Lens 134 has a focal length, e.g., of about 100 mm, for reducing image size. Next, the beam encounters a series of turning mirrors 135, 136 and 137 for directing the fourth beam finally into an aperture of camera 132. Camera 132 is preferably a standard, high magnification, high resolution video camera, e.g., 1024×1024.

Alternatively or concurrently therewith, a third device or DUV imaging and transmission measurement system 138 is provided for viewing and analysis of the mask during navigation. This device provides extended spectral sensitivity as compared to cameras 121 or 132, namely extended performance at shorter wavelengths than can be seen by the human eye. This results in superior resolution. The third device is optionally integrated into microscope 120 with cameras 121 and 132. Integration is accomplished by placing a beam splitter 139 between turning mirrors 136 and 137, the beam splitter dividing the fourth beam into fifth and sixth beams 140 and 141, respectively. Specifically, the fifth beam is aimed at third device 138 for viewing, whereas the sixth beam is directed into camera 132 when high magnification, high resolution viewing is desired.

Also illustrated in FIG. 10 is a microscope arm assembly 148, according to one embodiment of the present invention. The assembly includes a camera stand 149 mounting, for instance, first device or camera 121 for viewing the photomask during navigation. Also provided are a series of lens holders 130, 131 and 150 mounting lenses 91, 92 and 93, respectively, and a turning mirror 129. Motorized aperture assembly 80 is positioned for reception of light from the substage illuminator. An anti-backlash z-column focusing system 152 is positioned appropriately for selected adjustment of the arm assembly. A motorized wave plate is also provided for making partially transmitting defects more visible as a result of the phase shift encountered by light transmitted through the defect.

Figure 14:
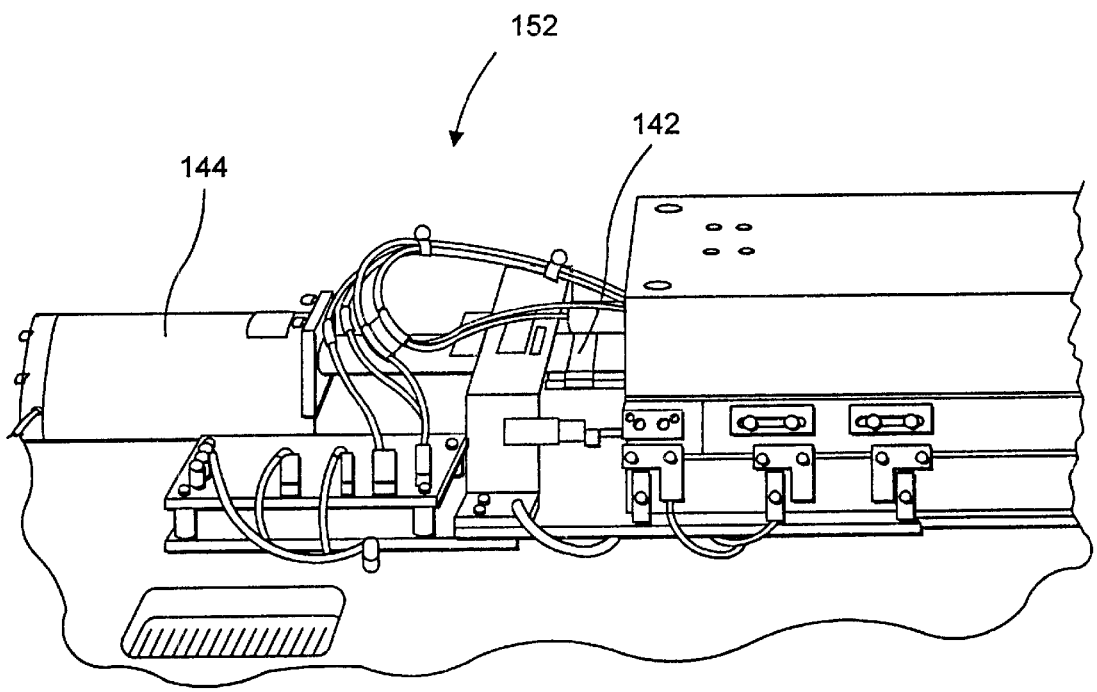
FIG. 14 is a perspective view of a step motor assembly of the present invention showing the step motor, piezoelectric fine focus, and anti-backlash z-column.
Figure 11:
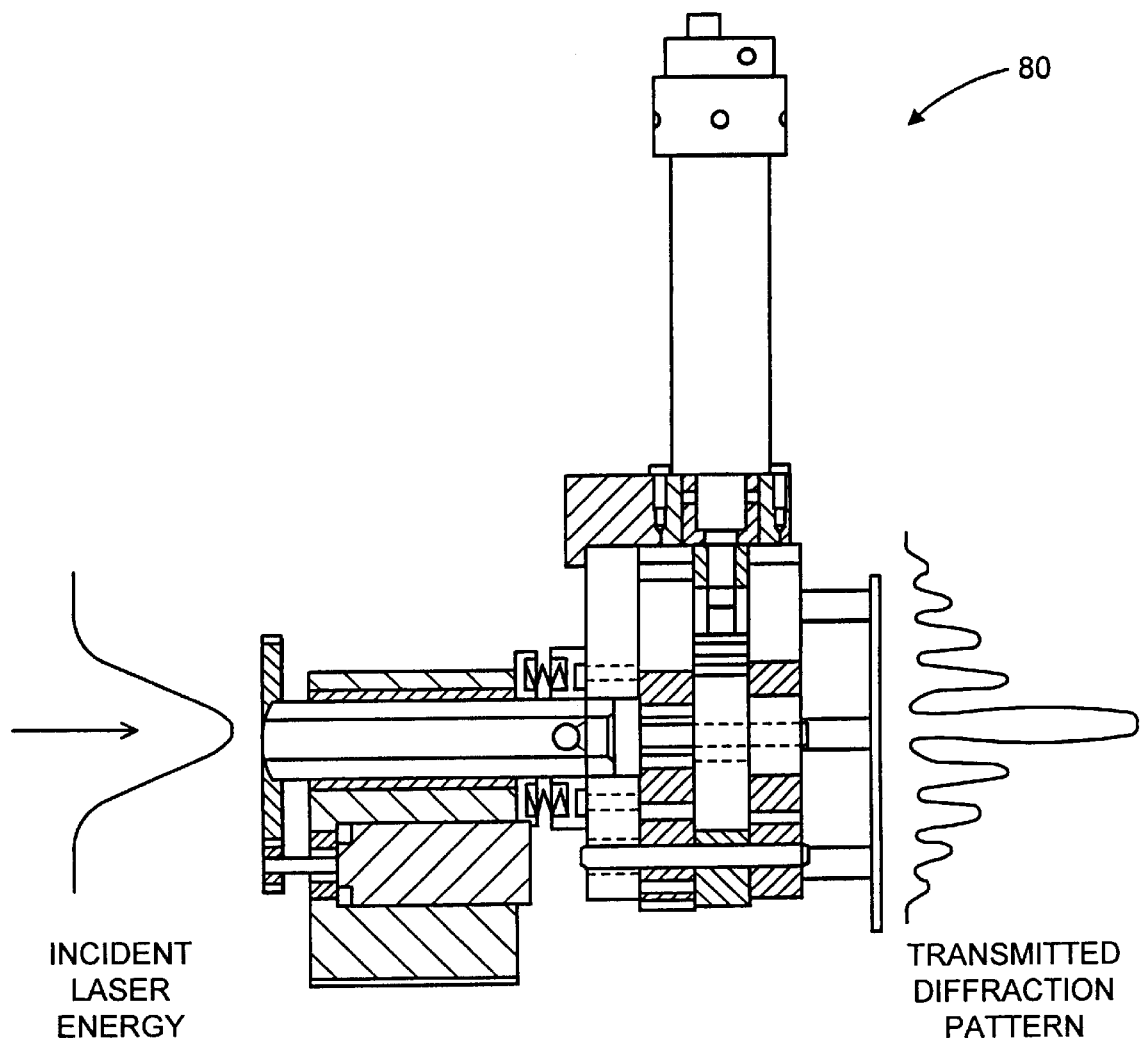
FIG. 11 is a cross sectional view of the motorized aperture assembly set forth in FIG. 10.

Anti-backlash z-column focusing system 152, in accordance with the present invention, is best seen in FIGS. 14 and 15. This system is equipped with a coarse motion translation stage 142 with adjustment error, e.g., within a range of ±0.50 in., and a fine motion translation stage 143 having adjustment error, e.g., within a range of ±50 $\mu$m. The coarse motion stage uses a stepper motor 144 and compound stepping motor leadscrew 145, such as 40 TPI, for movement of microscope turret 59 and objective 84 within proximity of the photo-mask.

Fine motion adjustment is then accomplished using the fine motion translation stage. This stage comprises a piezoelectric (or PZT) translator 146 and PZT preload spring 147, in combination, for extraordinarily fine movement of the microscope objective, generally in an up and down direction, i.e., toward and away from the mask. This arrangement is advantageous in eliminating backlash or dead space upon change in direction of leadscrew 145. It also accurately and bi-directionally positions and maintains the microscope objective within a selected tolerance, e.g., about 10 nm.

Figure 17:
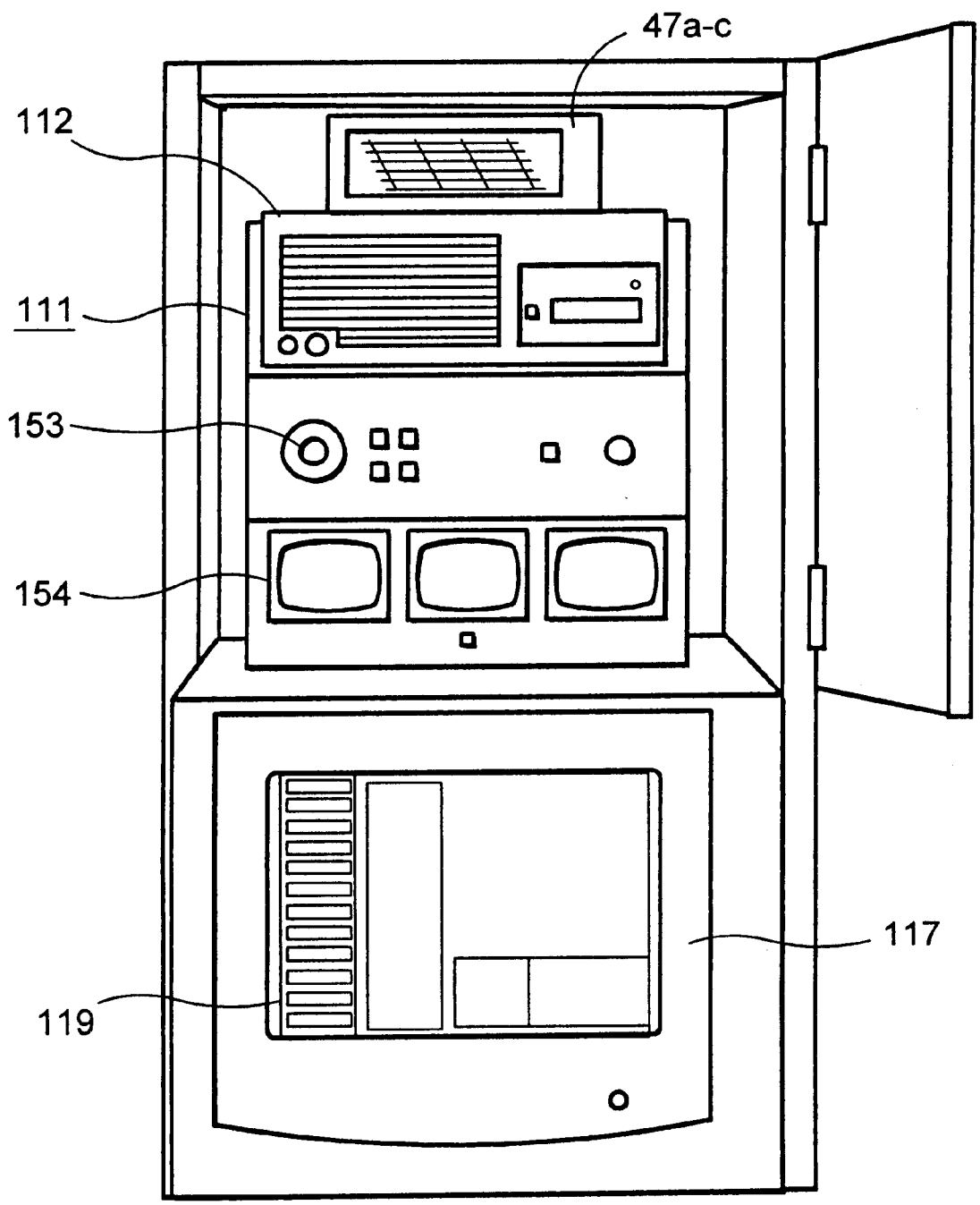
FIG. 17 is a front view of a computer control system in accordance with the present invention.

Operation of microscope 120 and other operative components of the present invention is monitored and controlled by computer device 110, in particular, computer control system 111 shown generally in FIGS. 1, 17 and 18. Appropriate data processing functions are provided by a main computer 112, e.g., an industrial grade, Pentium 2 processor equipped, computer, with display 117, e.g., a 21" monitor, and an input device 118 such as a mouse, joystick, keyboard or the like. The computer houses applications programming, e.g., conventional software, for image processing functions 113, motor control functions 114, stage system control function 115, and laser operation function 116.

The image processing functions are provided for spot marker illumination camera 101 and for the camera systems of the video microscope, namely, low magnification camera 121, high magnification camera 132, and optional DUV imaging and transmission measurement system 138. Motor control function 114 affords controlled operation of motorized aperture 80 for incremental mask repair, incremental movement of turning laser mirror 71, video camera focus functions, and like motion control. Function 115 which supplies X-Y stage system movement and control is preferably separate and distinct, operationally, from the other functions, the practicality of which will be understood by those skilled in the art. As for laser function 116, it effects synchronized laser beam actuation and control.

Generally speaking, functions 113≧116 may be operated interactively by the user using display screen or operator's monitor 117 and input device 118 such as a joystick, mouse, keyboard or the like. For example, change in magnification is effected by selecting an appropriate command on a computer-display menu 119 using, for instance, a joystick. Similarly, where change in magnitude of incremental movement is desired for the motorized aperture, information for effecting this change is input using menu 119. Likewise, to alter the increments for effecting sequential angular manipulation of the laser beam, such as from 4 incremental movements to 10, a joystick, for instance, is used to input the appropriate information to the control function on the menu, thereby effecting the corresponding change. Yet another function controllable by the user is actuation of the microscope turret to alter the degree of magnification upon navigation about the photo-mask. This function is also menu driven.

In addition to main computer 112, operators monitor 117 and input device 118, computer control system 111 is preferably housed in proximity to energy meters 47a–c, i.e., pump energy meter 47a, amplifier energy meter 47b, and SHG-output energy meter 47c. This arrangement is shown generally in FIG. 17. An emergency stop paddle device 153 is also provided for automatic shutdown of laser delivery system 10. In this connection, user observation and system control are facilitated by service monitors 154.

Turning now to FIG. 18, positioned desirably at the system rear for ready access by the operator is piezoelectric translator 146 (or PZT drive) and, below it, a repair unit amplifier box 155 (or RUAB). A relatively low voltage power supply 156 with power input is also desirably located adjacent to the foregoing assembly and beneath it, a system power distribution control system 157 and an electronic system interconnect panel 158. Finally, at the bottom of this arrangement, a laser cooler is located to facilitate optimum performance of the laser deliver system.

Figure 19:
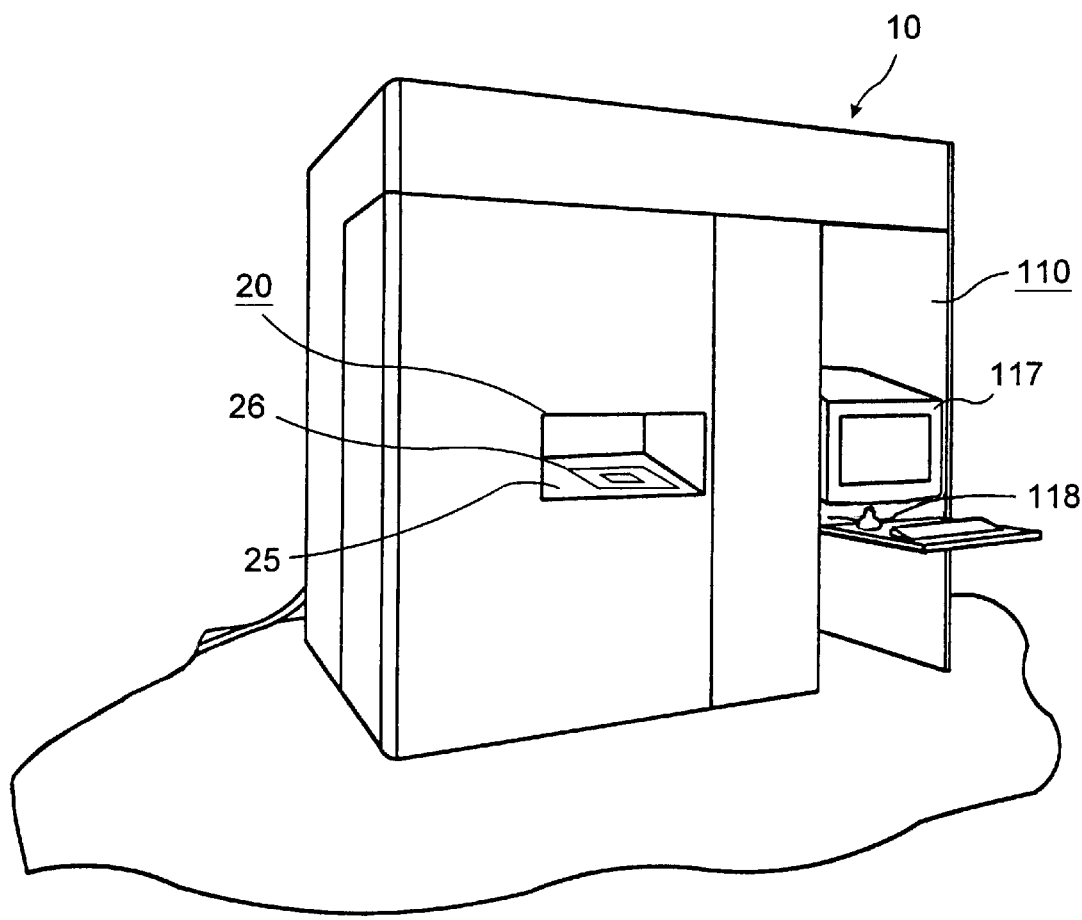
FIG. 19 is a perspective view of a laser delivery system according to another aspect of the present invention.

As shown generally in FIG. 19, the foregoing components or features of the present invention are optionally located within a housing 160, whether a selected feature or any combination of features. This is done not only to protect the system components and provide an isolated or controlled environment for system operation, but also to enhance system practicality and aesthetics. Among the various system components, stage system 20, operators monitor 117 and input device 118 should be readily accessible to the user as will be appreciated by those skilled in the art.

In operation, the laser delivery system of the present invention provides a novel method for loading photo-masks of varying thicknesses and for preserving top reference of the same. This method is performed by stage system 20 which holds and manipulates photo-mask 11 during viewing and repair. Specifically, the unique subsystem design of the mask holder or structure 21 not only allows masks of varying thicknesses to be used, but also repeated positioning of their work surface to within extraordinarily small working distances, e.g., 0.001 inch, of relatively high NA, microscope objectives 85–89.

Another embodiment of the present invention relates to a method for photolithographic mask repair. Initially, the photo-mask is located on the relatively stationary, isolated support structure. The laser emitting device is then actuated for effecting mask repair. The light source adjacent to the support structure is also activated for selected illumination of the mask. Alternatively, the light source may first be activated, the laser emitting device actuated, and then the photo-mask mounted to the support structure.

Next, the laser beam emitted from the laser emitting device is passed through the laser processor for effecting sequential angular manipulation of the laser beam, the processor including the adjustable beam splitter for effecting off-axis illumination of the laser beam, the motorized aperture for facilitating incremental mask repair, the optical system for image reduction, and, in turn, the device for viewing the mask during repair. Thereafter, sequential angular manipulation is controlled so as to capture a generally complete waveform of the beam. Simultaneously with the sequential angular manipulation, multi-aspect viewing of the mask is provided during navigation of the beam about the mask, fine motion control of the beam is effected, controlled movement of the motorized aperture is provided for effecting the sequential angular manipulation, support structure movement is controlled, and image data is processed.

Another method according to the present invention relates to locking the air bearing stage system. In general, to attain optimum performance, the laser delivery system is equipped with stage brake system 29. For instance, as shown in FIG. 5A, to lock the stage system, air pressure on stage brakes 29a, 29b is released, allowing them to come into contact with the top of the stage structure. Specifically, upon activation, the brakes lock the floating stage components to structure top 25 (a.k.a. granite base). This arrangement provides sufficient friction to hold the stage and photo-mask motionless. Servo gain is then set to zero, effectively disconnecting the interferometer and motors from the positioning task. To unlock the stage system, the foregoing steps are followed in reverse; in particular, the servo gain is first set to zero, then the stage brakes are pressurized such that they disengage from the top of the structure. The foregoing arrangement is particularly advantageous as it permits the photo-mask to be engaged and disengaged without disturbing the stage position (X, Y, Z).

Another method, according to the present invention, relates to improving images of defects in photo-mask patterns by varying image magnification, illumination wavelength, illumination angle and/or polarization. This may be accomplished by the integration of several apparatus. First, use of motorized turret 59 with five objectives 85–89, as shown in FIG. 16, allows selection of a magnification commensurate with defect size and the detail of viewing desired. To make defects in the photo-mask detectable, this feature is then combined with the four narrow line width optical filters, movable substage condenser, and motorized wave plate.

Overall, the present invention advantageously allows simultaneous illumination, viewing and repair of patterns on photo-masks. Its anti-backlash and infinity corrected optical microscope system permits inclusion of a beam splitting mirror to couple laser energy into the system that is normally used for imaging. By using off-axis laser illumination, defect viewing is also considerably improved. Some of the light scattered by the small defect is collected by the microscope system bringing the operators attention to a smaller region of interest. In this manner, extremely small defects in photo-mask patterns are now easily detectable.

The present invention further enables previewing of the repair result. Specifically, a real-time system for previewing the repair area is created by placing a camera behind the laser aperture. The camera receives an image of the aperture, back-lit by the substage illuminator. Since the aperture is defined to be in a field plane conjugate with the microscope image, an image of the mask in the region to be exposed to the laser pulses is also observable. This preview capability, in combination with beam fine motion and the stage brake system, enable repair of edge defects at better than sub 50 nm accuracy.

Still another advantage of the present invention is the elimination or dispersion of deposits of removed material in the neighborhood of repair. Small amounts of material removed by ablation are typically deposited on the mask as a thin uniform film in a circular area approximately 30 microns in diameter. The deposited film, it has been found, reduces considerably the optical transmission in the clear areas of the mask pattern so coated. By creating a moving gas atmosphere, the deposited film is greatly diluted and the resulting film spread over a larger area, increasing the optical transmission in clear areas adjacent to the repair site. This further enhances repair results.

Alternatively, repair results may be improved by collecting the defect material. For example, electrodes are placed in the vicinity of repair. The ionized particles are ejected and collected prior to their deposition on the surface, increasing the optical transmission in the clear areas adjacent to the repair site.

A further benefit of the present invention is enhanced machining efficiency due to the oxidizing atmosphere created thereabout. This is accomplished by halocarbon ($CBr_2F_2$ or $CF_4$) gases which absorb laser radiation at wavelengths below 500 nm. Halocarbon molecules are photolytically decomposed by laser radiation, producing activated oxidizing fluorine radicals that enhance laser removal rate.

In summary, the laser delivery system of the present invention provides the following features: loading photo-masks of varying thickness and preserving top reference; illuminating and concurrently viewing patterns on and allowing repair of photo-masks; improving images by varying image magnification, illumination wavelength, illumination angle and/or polarization; improving defect viewing using off-axis laser illumination; repeatable control of the defect repair process using machine vision; actuating focusing mechanism without backlash; auto-focusing a microscope system; locking an air bearing stage system; defining the laser target interaction area; precisely moving beam to target area; previewing the repair result; repairing opaque defects on peliclized photo-masks; repairing foreign material defects on peliclized photo-masks; alternatively repairing opaque defects on peliclized photo-masks; alternatively repairing foreign material defects on peliclized photo-masks; homogenizing laser exposure in repaired area; eliminating opaque defects; eliminating foreign material defects; eliminating the deposition of removed material in the neighborhood of repair; alternatively collecting removed material; improving machining efficiency by creating an oxidizing atmosphere; improving the selectivity of a laser machining process to preferentially remove opaque films from glass substrates; and improving the selectivity of a laser machining process to preferentially remove such material from photo-masks.

Various modifications and alterations to the present invention may be appreciated based on a review of this disclosure. These changes and additions are intended to be within the scope and spirit of this invention as defined by the following claims.

What is claimed is:

1. A system for photolithographic mask repair which comprises:
    a structure for supporting a mask to be operated on;
    a laser emitting device for effecting mask repair;
    a light source adjacent the support structure for selected illumination of the mask;
    a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair;
    a computer device for controlling the sequential angular manipulation so as to capture a generally complete waveform of the beam; and
    a microscope for multi-aspect viewing of the mask during navigation of the beam about the mask.

2. The system set forth in claim 1 wherein the structure for supporting the mask is a retractable platform.

3. The system set forth in claim 1 wherein the laser emitting device emits an amplified Ti:S laser.

4. The system set forth in claim 1 wherein the laser emitting device emits a He:Cd laser.

5. The system set forth in claim 1 wherein the laser emitting device emits a Nd:Yag laser.

6. The system set forth in claim 1 wherein the computer device, simultaneously with manipulation of the laser, effects fine motion control of the beam.

7. The system set forth in claim 6 wherein the computer device, simultaneously with fine motion control of the beam, effects controlled movement of a motorized aperture for effecting the sequential angular manipulation.

8. The system set forth in claim 7 wherein the computer device, simultaneously with controlling movement of the motorized aperture, effects controlled support structure movement.

9. The system set forth in claim 8 wherein the computer device, simultaneously with controlling movement of the platform, processes image data.

10. The system set forth in claim 1 wherein the microscope is a video microscope for viewing and analyzing the mask.

11. The system set forth in claim 10 wherein the microscope includes a relatively low magnification video camera and a relatively high magnification video camera.

12. The system set forth in claim 10 wherein the microscope includes a DUV imaging and transmission measurement system.

13. A system for photolithographic mask repair which comprises:
    a structure for supporting a mask to be operated on;
    a laser emitting device for effecting mask repair;
    a light source adjacent to the support structure for selected illumination of the mask;
    a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair;
    a computer device for controlling the sequential angular manipulation so as to capture a generally complete waveform of the beam; and
    a microscope for multi-aspect viewing of the mask during navigation of the beam about the mask, the computer device, simultaneously with manipulation of the beam, effecting fine motion control of the beam, controlled movement of the motorized aperture for effecting the sequential angular manipulation, controlled support structure movement, and image data processing.

14. The system set forth in claim 13 wherein the structure for supporting the mask is a retractable platform.

15. The system set forth in claim 13 wherein the laser emitting device emits an amplified Ti:S laser.

16. The system set forth in claim 13 wherein the laser emitting device emits a He:Cd laser.

17. The system set forth in claim 13 wherein the laser emitting device emits a Nd:Yag laser.

18. A system for photolithographic mask repair which comprises:
    a structure for supporting a mask to be operated on;
    a laser emitting device for effecting mask repair;
    a light source adjacent to the support structure for selected illumination of the mask;
    a laser processor for effecting sequential angular manipulation of a laser beam projecting from the laser emitting device;
    a computer device for controlling the sequential angular manipulation as to capture a generally complete waveform of the beam; and
    a microscope for multi-aspect viewing of the mask during navigation of the beam about the mask, the microscope including a relatively low magnification video camera, a relatively high magnification video camera, and a DUV imaging and transmission measurement system.

19. A system for photolithographic mask repair which comprises:

a structure for supporting a mask to be operated on;

a laser emitting device for effecting mask repair;

a light source adjacent to the support structure for selected illumination of the mask;

a laser processor for effecting sequential angular manipulation of a laser beam projecting from the laser emitting device;

a computer device for controlling the sequential angular manipulation as to capture a generally complete waveform of the beam; and a microscope for multi-aspect viewing of the mask during navigation of the beam about the mask.

20. A system for photolithographic mask repair which comprises:

a mask to be operated on;

a laser emitting device for effecting mask repair;

a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair;

a computer device for controlling the sequential angular manipulation so as to capture a generally complete waveform of the beam; and a microscope for multi-aspect viewing of the mask during navigation of the beam about the mask.

21. A system for photolithographic mask repair which comprises a mask to be operated on, a laser emitting device for effecting mask repair, and a laser processor for effecting sequential angular manipulation of a laser beam projecting from the laser emitting device, the processor including an adjustable beam splitter for effecting off-axis laser illumination, a motorized aperture for facilitating incremental mask repair, an optical system for image reduction, and a device for viewing the mask during repair.

22. A method for photolithographic mask repair comprising the steps of:

i. locating a photo-mask on a relatively stationary, isolated support structure;

ii. activating a laser emitting device for effecting mask repair;

iii. actuating a light source adjacent to the support structure for selected illumination of the mask;

iv. passing a laser beam emitted from the laser emitting device through a laser processor for effecting sequential angular manipulation of the laser beam, the processor including an adjustable beam splitter for effecting off-axis illumination of the laser beam, a motorized aperture for facilitating incremental mask repair, an optical system for image reduction, and a device for viewing the mask during repair;

v. controlling the sequential angular manipulation so as to capture a generally complete waveform of the beam; and vi. simultaneously with the sequential angular manipulation, providing multi-aspect viewing of the mask during navigation of the beam about the mask, effecting fine motion control of the beam, controlled movement of the motorized aperture for effecting the sequential angular manipulation, controlled support structure movement, and image data processing.

23. A method for photolithographic mask repair comprising the steps of:

i. activating a laser emitting device for effecting mask repair;

ii. locating a photo-mask on a relatively stationary, isolated support structure;

iii. actuating a light source adjacent to the support structure for selected illumination of the mask;

iv. passing a laser beam emitted from the laser emitting device through a laser processor for effecting sequential angular manipulation of the laser beam, the processor including an adjustable beam splitter for effecting off-axis illumination of the laser beam, a motorized aperture for facilitating incremental mask repair, an optical system for image reduction, and a device for viewing the mask during repair;

v. controlling the sequential angular manipulation so as to capture a generally complete waveform of the beam; and vi. simultaneously with the sequential angular manipulation, providing multi-aspect viewing of the mask during navigation of the beam about the mask, effecting fine motion control of the beam, controlled movement of the motorized aperture for effecting the sequential angular manipulation, controlled support structure movement, and image data processing.

24. A method for photolithographic mask repair comprising the steps of:

i. activating a laser emitting device for effecting mask repair;

ii. actuating a light source adjacent to the support structure for selected illumination of the mask;

iii. locating a photo-mask on a relatively stationary, isolated support structure;

iv. passing a laser beam emitted from the laser emitting device through a laser processor for effecting sequential angular manipulation of the laser beam, the processor including an adjustable beam splitter for effecting off-axis illumination of the laser beam, a motorized aperture for facilitating incremental mask repair, an optical system for image reduction, and a device for viewing the mask during repair;

v. controlling the sequential angular manipulation so as to capture a generally complete waveform of the beam; and vi. simultaneously with the sequential angular manipulation, providing multi-aspect viewing of the mask during navigation of the beam about the mask, effecting fine motion control of the beam, controlled movement of the motorized aperture for effecting the sequential angular manipulation, controlled support structure movement, and image data processing.

* * * * *